US012581717B2

(12) United States Patent
Dewey et al.

(10) Patent No.: US 12,581,717 B2
(45) Date of Patent: Mar. 17, 2026

(54) FRONTSIDE AND BACKSIDE EPI CONTACT

(71) Applicant: Intel Corporation, Santa Clara, CA (US)

(72) Inventors: Gilbert Dewey, Beaverton, OR (US); Cheng-Ying Huang, Hillsboro, OR (US); Nicole K. Thomas, Portland, OR (US); Marko Radosavljevic, Portland, OR (US); Patrick Morrow, Portland, OR (US); Ashish Agrawal, Hillsboro, OR (US); Willy Rachmady, Beaverton, OR (US); Seung Hoon Sung, Portland, OR (US); Christopher M. Neumann, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 940 days.

(21) Appl. No.: 17/556,711

(22) Filed: Dec. 20, 2021

(65) Prior Publication Data

US 2023/0197569 A1 Jun. 22, 2023

(51) Int. Cl.
H10D 84/01 (2025.01)
H01L 23/48 (2006.01)
(Continued)

(52) U.S. Cl.
CPC ....... H10D 84/0149 (2025.01); H01L 23/481 (2013.01); H10D 30/6735 (2025.01);
(Continued)

(58) Field of Classification Search
CPC .. H01L 23/481; H10D 30/01; H10D 30/0198; H10D 30/024; H10D 30/031;
(Continued)

(56) References Cited

U.S. PATENT DOCUMENTS

2008/0048217 A1 2/2008 Kim et al.
2018/0204932 A1 7/2018 Mehandru et al.
(Continued)

FOREIGN PATENT DOCUMENTS

CN 113675194 A 11/2021

OTHER PUBLICATIONS

Extended European Search Report received for EP Application No. 22201365.8 dated May 3, 2023. 11 pages.

*Primary Examiner* — Cheung Lee
(74) *Attorney, Agent, or Firm* — Arcane Law PLLC

(57) ABSTRACT

Techniques are provided herein to form semiconductor devices having a frontside and backside contact in an epi region of a stacked transistor configuration. In one example, an n-channel device and a p-channel device may both be GAA transistors where the n-channel device is located vertically above the p-channel device (or vice versa). Source or drain regions are adjacent to both ends of the n-channel device and the p-channel device. Deep and narrow contacts may be formed from both the frontside and the backside of the integrated circuit through the stacked source or drain regions. The contacts may physically contact each other to form a combined contact that extends through an entirety of the stacked source or drain regions. The higher contact area provided to both source or drain regions provides a more robust ohmic contact with a lower contact resistance compared to previous contact architectures.

20 Claims, 16 Drawing Sheets

(51) Int. Cl.

| | |
|---|---|
| *H10D 30/67* | (2025.01) |
| *H10D 62/10* | (2025.01) |
| *H10D 84/03* | (2025.01) |
| *H10D 84/85* | (2025.01) |

(52) U.S. Cl.
CPC ....... *H10D 30/6757* (2025.01); *H10D 62/118* (2025.01); *H10D 84/038* (2025.01); *H10D 84/85* (2025.01)

(58) Field of Classification Search
CPC ........... H10D 30/0321; H10D 30/0323; H10D 30/0327; H10D 30/501–509; H10D 30/62; H10D 30/9713; H10D 30/9735; H10D 30/674; H10D 30/6757; H10D 62/118; H10D 62/121; H10D 62/151; H10D 84/01; H10D 84/0126; H10D 84/013; H10D 84/0149; H10D 84/0158; H10D 84/0165; H10D 84/0186; H10D 84/0193; H10D 84/038; H10D 84/8311; H10D 84/8312; H10D 84/83135; H10D 84/83138; H10D 84/8314; H10D 84/8316; H10D 84/85; H10D 84/851–852; H10D 84/853; H10D 30/6713; H10D 30/6735
See application file for complete search history.

(56) References Cited

U.S. PATENT DOCUMENTS

| | | | |
|---|---|---|---|
| 2020/0105751 A1* | 4/2020 | Dewey ................. | H10D 62/235 |
| 2020/0105753 A1 | 4/2020 | Kotlyar et al. | |
| 2021/0366906 A1 | 11/2021 | Huang et al. | |

* cited by examiner

400

FORM FIRST SECTION OF FIN HAVING ALTERNATING FIRST AND SECOND LAYERS — 402

FORM SECOND SECTION OF FIN HAVING ALTERNATING THIRD AND FOURTH LAYERS — 404

FORM SACRIFICIAL PLUG ADJACENT TO THE FIN — 406

FORM FIRST SOURCE OR DRAIN REGION COUPLED TO ENDS OF THE SECOND LAYERS — 408

FORM SECOND SOURCE OR DRAIN REGION COUPLED TO ENDS OF THE FOURTH LAYERS — 410

FORM FIRST CONDUCTIVE CONTACT EXTENDING THROUGH THE SECOND SOURCE OR DRAIN REGION — 412

REMOVE THE SACRIFICIAL PLUG FROM THE BACKSIDE — 414

FORM SECOND CONDUCTIVE CONTACT FROM THE BACKSIDE THAT EXTENDS THROUGH THE FIRST SOURCE OR DRAIN REGION AND DIRECTLY CONTACTS THE FIRST CONDUCTIVE CONTACT — 416

FIG. 4

FRONTSIDE AND BACKSIDE EPI CONTACT

FIELD OF THE DISCLOSURE

The present disclosure relates to integrated circuits, and more particularly, to the epi region contact formation for transistor devices.

BACKGROUND

As integrated circuits continue to scale downward in size, a number of challenges arise. For instance, reducing the size of memory and logic cells or otherwise increasing device density is becoming increasingly more difficult. One possible solution to increase device density is to stack transistor devices in a vertical direction. As a result, providing contacts to the structures of such stacked devices becomes difficult. There are many non-trivial challenges involved with the fabrication of such stacked devices and the fabrication of contacts to the associated device structures.

BRIEF DESCRIPTION OF THE DRAWINGS

FIG. 4 is a flowchart of a fabrication process for a semiconductor device having a combined frontside and backside contact in the epi region, in accordance with an embodiment of the present disclosure.

Figure 1:
FIG. 1 is a cross-sectional view of an example integrated circuit having a semiconductor device with a particular contact structure in the epi region, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form gate-all-around (GAA) semiconductor devices having a combined frontside and backside contact in an epi region of a stacked transistor configuration. The techniques can be used in any number of transistor technologies, but are particularly useful in a stacked nanoribbon transistor configuration (e.g., stacked in a vertical z-direction from the substrate surface) or forksheet transistor configuration. In one example, two different semiconductor devices of a given memory or logic cell such as a synchronous random access memory (SRAM) cell, or a complementary metal oxide semiconductor (CMOS) cell, include a p-channel device and an n-channel device. More specifically, the n-channel device and the p-channel device may both be GAA transistors each having any number of nanoribbons extending in the same direction where the n-channel device is located vertically above the p-channel device (or vice versa). Source or drain regions are adjacent to both ends of the n-channel device and the p-channel device, such that a source or drain region of one device is located vertically over the source or drain region of the other device. Deep and narrow contacts may be formed from both the frontside and the backside of the integrated circuit through the stacked source or drain regions. The narrow contacts may physically contact each other to form a combined contact that extends through an entirety of the stacked source or drain regions in the vertical direction. Since both frontside and backside contacts are utilized, the epi contact has a high contact area to both the top source or drain region and the bottom source or drain region. The higher contact area provided to both the source or drain regions provides a more robust ohmic contact with a lower contact resistance compared to previous contact architectures. Furthermore, the vertically integrated contact provides area scaling advantages in many circuit architectures, such as a CMOS inverter. Numerous variations and embodiments will be apparent in light of this disclosure.

General Overview

As previously noted above, there remain a number of non-trivial challenges with respect to designing gate-all-around (GAA) semiconductor devices. In the case of stacked nanoribbon transistors, for example, the stacked structures can cause complications for providing electrical contact to the lower structures. For example, source or drain epi regions may be stacked over one another with an insulative barrier layer between them. In order to contact the lower source or drain epi region, a narrow contact may be formed from the frontside through the top source or drain region and through the barrier layer to also contact the bottom source or drain region. However, the contact area between the contact and the bottom source or drain region is small compared to the top source or drain region, which can cause problems with the device operation. Furthermore, forming such a deep and narrow contact brings numerous fabrication challenges, including causing damage to sensitive portions of the bottom source or drain region that further increases the contact resistance.

Thus, and in accordance with an embodiment of the present disclosure, techniques are provided herein to form a combined frontside and backside contact through each of the top and bottom source or drain regions to provide a high contact area to both the top and bottom source or drain regions. A frontside contact may first be formed through a top source or drain region while a backside contact may be later formed a bottom source or drain region beneath the frontside contact. According to some embodiments, an etching process used to form the recess for the backside contact exposes at least a portion of the frontside contact, such that forming the backside contact in the recess causes the backside contact to be formed on a portion of the frontside contact. Accordingly, the frontside and backside contacts are effectively combined into a single contact that extends through both the stacked top and bottom source or drain regions. In some embodiments, the frontside contact and backside contact touch one another within the insulative barrier layer that exists between the top and bottom source or drain regions. By using separate frontside and backside etches to form the combined contact, a high contact area can be maintained between both the top and bottom source or drain regions with a higher degree of control over the shape of the contact (e.g., keeping the contact narrow enough to not damage sensitive epi regions on the edges). Although description herein focuses on the use of GAA transistor configurations, the techniques can be applied to other channel configurations as well, such as finFETs, stacked finFETs, or horizontally stacked trigate FET devices.

According to an embodiment, an integrated circuit includes a first semiconductor device having one or more first semiconductor nanoribbons extending in a first direction between a first source or drain region and a second source or drain region and a second semiconductor device having one or more second semiconductor nanoribbons extending in the first direction between a third source or drain region and a fourth source or drain region. The one or more first semiconductor nanoribbons are spaced vertically from the one or more second semiconductor nanoribbons in a second direction different from the first direction and the third source or drain region is spaced vertically from the first source or drain region in the second direction. The integrated circuit also includes an insulating layer between the first source or drain region and the third source or drain region, a first conductive contact extending through the first source or drain region in the second direction, and a second conductive contact extending through the third source or drain region in the second direction. The second conductive contact directly contacts the first conductive contact.

According to another embodiment, an electronic device includes a chip package having one or more dies. At least one of the one or more dies includes a first semiconductor device having one or more first semiconductor nanoribbons extending in a first direction between a first source or drain region and a second source or drain region and a second semiconductor device having one or more second semiconductor nanoribbons extending in the first direction between a third source or drain region and a fourth source or drain region. The one or more first semiconductor nanoribbons are spaced vertically from the one or more second semiconductor nanoribbons in a second direction different from the first direction and the third source or drain region is spaced vertically from the first source or drain region in the second direction. The at least one of the one or more dies also includes an insulating layer between the first source or drain region and the third source or drain region, and a conductive contact extending through an entire thickness of the first source or drain region in the second direction, an entire thickness of the insulating layer in the second direction, and an entire thickness of the third source or drain region in the second direction.

According to another embodiment, a method of forming an integrated circuit includes forming a multilayer fin over a substrate having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a sacrificial plug adjacent to the multilayer fin; forming a first source or drain region over the sacrificial plug and coupled to the ends of the second material layers; forming an insulating layer over the first source or drain region; forming a second source or drain region coupled to the ends of the fourth material layers and over the insulating layer; forming a first conductive contact that extends through the second source or drain region; removing the sacrificial plug from a backside of the substrate; and forming a second conductive contact from the backside of the substrate that extends through the first source or drain region, such that the second conductive contact directly contacts the first conductive contact.

The techniques are especially suited for use with gate-all-around transistors such as nanowire and nanoribbon transistors, but may also be applicable in some instances to finFET devices (e.g., stacked finFET structures). The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate an epi contact in a stacked transistor configuration that extends through an entirety of a top source or drain region and a bottom source or drain region. In some examples, the epi contact may include a divot or recess near its midsection to indicate that the epi contact was formed using two different contacts (e.g., a frontside contact and a backside contact) that meet together at a certain point where the divot or recess is observed.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1 is a cross sectional view of a portion of an integrated circuit 100 that includes a first semiconductor device 101 and a second semiconductor device 103, where second semiconductor device 103 is stacked vertically over first semiconductor device 101, according to an embodiment of the present disclosure. The cross section view is taken lengthwise (perpendicular to gate structure) across first semiconductor device 101 and second semiconductor device 103 in a first direction while the devices are vertically stacked over one another in a second direction substantially orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of integrated circuit 100 that may contain any number of similar semiconductor devices. While other semiconductor devices may be illustrated, such as the stacked devices on the right of FIG. 1, reference herein is made to the structures of semiconductor devices 101 and 103 for ease of discussion. The description of such structures may apply equally to the corresponding structures of other stacked semiconductor devices in integrated circuit 100.

As can be seen, integrated circuit 100 is formed over a dielectric base layer 102. According to some embodiments, dielectric base layer 102 is formed after the removal of a substrate during backside processing, as will be described in more detail herein. Dielectric base layer 102 may be any suitable dielectric material, such as silicon dioxide, aluminum oxide, or silicon oxycarbonitride.

First semiconductor device 101 may include any number of semiconductor nanoribbons 104 extending between a first source or drain region and a second source or drain region (not illustrated). According to some embodiments, the first source or drain region includes epitaxially grown material that is shared between semiconductor nanoribbons 104 of first semiconductor device 101 and semiconductor nanoribbons of an adjacent semiconductor device. According to some embodiments, the first source or drain region includes different epitaxial regions. For example, the first source or drain region includes first epitaxial portions 106 and 107 that are grown directly from the tips of semiconductor nanoribbons 104 and the semiconductor nanoribbons of the adjacent device, respectively, and a second epitaxial portion 108 that fills in the remaining area around the first epitaxial portions 106/107. In some examples, first epitaxial portion 106 represents individual nubs or islands of epitaxial material grown from the ends of each of semiconductor nanoribbons 104, such that the epitaxial growths do not all merge together. In some examples, like the one illustrated, such epitaxial growths from the ends of each of semiconductor nanoribbons 104 merge together along the side of the device. According to some embodiments, second epitaxial portion 108 is formed over first epitaxial portions 106 and 107 and has a higher dopant concentration compared to first epitaxial portions 106 and 107.

Second semiconductor device 103 may include any number of semiconductor nanoribbons 110 extending between a third source or drain region and a fourth source or drain region (not illustrated). According to some embodiments, the third source or drain region includes epitaxially grown material that is shared between semiconductor nanoribbons 110 of second semiconductor device 103 and semiconductor nanoribbons of an adjacent semiconductor device. According to some embodiments, the third source or drain region includes different epitaxial regions. For example, the third source or drain region includes first epitaxial portions 112 and 113 that are grown directly from the tips of semiconductor nanoribbons 110 and the semiconductor nanoribbons of the adjacent device, respectively, and a second epitaxial portion 114 that fills in the remaining area around the first epitaxial portions 112/113. In some examples, first epitaxial portion 112 represents individual nubs or islands of epitaxial material grown from the ends of each of semiconductor nanoribbons 110, such that the epitaxial growths do not all merge together. In some examples, like the one illustrated, such epitaxial growths from the ends of each of semiconductor nanoribbons 110 merge together along the side of the device. According to some embodiments, second epitaxial portion 114 is formed over first epitaxial portions 112 and 113 and has a higher dopant concentration compared to first epitaxial portions 112 and 113.

Any of the source or drain regions may act as either a source region or a drain region, depending on the application and dopant profile. In some embodiments, semiconductor devices 101 and 103 have an equal number of nanoribbons, while in other embodiments they have an unequal number of nanoribbons. In some embodiments, each of nanoribbons 104 and nanoribbons 110 are formed from a fin of alternating material layers (e.g., alternating layers of silicon and silicon germanium) where sacrificial material layers are removed between nanoribbons 104 and nanoribbons 110. Each of nanoribbons 104 and nanoribbons 110 may include the same semiconductor material as an underlying substrate that is later removed to form base dielectric layer 102. In any such cases, and according to some embodiments, a vertical distance between about 10 nm and about 80 nm separates the nanoribbons 104 of first semiconductor device 101 from the nanoribbons 110 of second semiconductor device 103. Other embodiments may have a smaller or larger such vertical distance.

Any semiconductor materials suitable for source and drain regions can be used (e.g., group IV and group III-V semiconductor materials) for any of the illustrated source or drains regions. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

A gate structure 116 is provided over each of nanoribbons 104 and nanoribbons 110 in a shared gate architecture, according to some embodiments. In some other embodiments, a dielectric layer is present between nanoribbons 104 and nanoribbons 110 to produce a split gate architecture where a first gate structure around nanoribbons 104 is electrically isolated from a second gate structure around nanoribbons 110. The embodiments illustrated herein use the shared gate architecture but are equally applicable to split gate architectures.

Spacer structures 118 are included on either side of gate structure 116. Spacer structures 118 may include a dielectric material, such as silicon nitride, silicon oxynitride, or silicon oxycarbonitride. Gate structure 116 includes both a gate dielectric around each of nanoribbons 104 and nanoribbons 110 and a gate electrode over the gate dielectric. The gate dielectric may include a single material layer or multiple material layers. In some embodiments, the gate dielectric includes a first dielectric layer such as an oxide native to nanoribbons 104 and 110 (e.g., silicon oxide) and a second dielectric layer that includes a high-k material (e.g., such as hafnium oxide). The high-k dielectric material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide). In some embodiments, the gate dielectric around nanoribbons 104 has a different element doping concentration compared to the gate dielectric around nanoribbons 110. According to some embodiments, the doping element used in the gate dielectric is lanthanum.

According to some embodiments, the gate electrode extends over the gate dielectric around each of nanoribbons 104 and nanoribbons 110 and also generally fills the remaining space between the various nanoribbons of any number of stacked semiconductor devices. The gate electrode may include any sufficiently conductive material such as a metal, metal alloy, or doped polysilicon. In some embodiments, the gate electrode includes one or more workfunction metals around nanoribbons 104 and 110. In some embodiments, semiconductor device 101 is a p-channel device that includes n-type dopants within nanoribbons 104 and includes a workfunction metal having titanium around nanoribbons 104 and semiconductor device 103 is an n-channel device that includes p-type dopants within nanoribbons 110 and includes a workfunction metal having tungsten around nanoribbons 110. N-type dopants may also be used within the nanoribbons of an n-channel device and p-type dopants may be used within the nanoribbons of a p-channel device in order to tune the transistor's threshold voltage. The gate electrode may also include a fill metal or other conductive material around the workfunction metals to provide the whole gate electrode structure. According to some embodiments, the gate structure may be interrupted between any adjacent semiconductor devices in a third direction orthogonal to both the first and second directions by a gate cut structure.

Returning to the epitaxial regions adjacent to the nanoribbons, a bottom dielectric layer 120 may be present to isolate the first source or drain region from any underlying substrate or underlying material. A middle dielectric layer 122 may be present between the first source or drain region and the third source or drain region in the vertical direction to isolate the epi regions from one another. A top dielectric layer 124 may be present over the third source or drain region. Each of bottom dielectric layer 120, middle dielectric layer 122, and top dielectric layer 124 may be any suitable dielectric material, such as silicon oxide, silicon oxynitride, or silicon oxycarbonitride.

According to some embodiments, a conductive contact 126 may be formed that extends vertically (e.g., in the second direction) through each of at least the first source or drain region, the second source or drain region, and middle dielectric layer 122. Conductive contact 126 may also extend through a thickness of bottom dielectric layer 120 and top dielectric layer 124. Conductive contact 126 may include any conductive material such as copper (Cu), ruthenium (Ru), tungsten (W), cobalt (Co), titanium (Ti), molybdenum (Mo), or any alloys thereof. In some embodiments, conductive contact 126 includes one or more layers of different conductive materials, such as a liner that includes titanium silicide, tantalum silicide, titanium germanide, tantalum germanide, nitrogen germanide, or nitrogen silicide and a fill material that includes tungsten, ruthenium, molybdenum, or cobalt, to name a few examples. The silicide or germanide (or other semiconductor-metal layer that forms at the semiconductor-metal interface) that may form at the edges of conductive contact 126 can consume a portion of the epitaxial material, which is why it is desirable for conductive contact 126 to not contact any of first epitaxial portion 106 of the first source or drain region or any of first epitaxial portion 112 of the third source or drain region, according to some embodiments. Another relatively thin layer that may be provided is an adhesion layer, such as a layer of titanium nitride (TiN) or tantalum nitride (TaN). Such liner and adhesion layers can be considered part of an overall conductive contact structure 126 that includes one or more bodies of conductive fill material and possibly one or more relatively thin layers (e.g., such as TaN, TiN, silicide, germanide, or other resistance-reducing layers). The relatively thin layers, if present, may exist at the periphery of the given body of fill material, and have a thickness in the range of one to several monolayers to about 2 nanometers (nm), according to some embodiments.

Conductive contact 126 may be considered as a single monolithic contact which includes a continuous body of conductive fill material that extends between the frontside and backside of the device, such that there is no discernible interface between first and second bodies of conductive materials. However, in some examples, conductive contact 126 may be considered to be two separate contacts that meet together or otherwise interface with one another (thus forming a seam or interface line, as may be seen in a TEM/SEM cross-section) to form the conductive contact 126. According to some embodiments, conductive contact 126 includes a divot or recess 128 at a location where the frontside and backside contacts come together at their respective ends. In some such cases, for instance, and as will be discussed in more detail herein, the frontside and backside contacts may each have tapered ends that contact one another, thus creating divot or recess 128 at the point where they come together. In some embodiments, the frontside and backside contacts meet together within middle dielectric layer 122, as illustrated. According to some embodiments, conductive contact 126 may have a high aspect ratio between about 8:1 and about 12:1.

In some embodiments, a dielectric spacer 130 is present between a portion of conductive contact 126 and base dielectric layer 102. Dielectric spacer 130 may be used to form a smaller opening when forming the backside portion of conductive contact 126, as will be discussed in more detail herein. In some embodiments, dielectric spacer 130 is the same material as base dielectric layer 102.

Using a high-aspect ratio conductive contact 126 that spans between the source or drain regions of stacked transistors can be particularly useful in the architecture of a CMOS inverter. For example, an NMOS device may be stacked over a PMOS device such that conductive contact 126 connects the source regions of each of the NMOS and PMOS devices, as would be used in an inverter circuit. By using vertically stacked transistors and a vertically integrated contact, as much as a 50% reduction in the area footprint of the inverter cell can be realized in comparison to non-stacked transistors and planar interconnect structures.

Fabrication Methodology

FIGS. 2A-2L include cross-sectional views that collectively illustrate an example process for forming an integrated circuit configured with stacked semiconductor devices having a combined frontside and backside epi contact. Each figure shows an example structure that results from the process flow up to that point in time, so the depicted structure evolves as the process flow continues, culminating in the structure shown in FIG. 2L, which is similar to the structure illustrated in FIG. 1. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
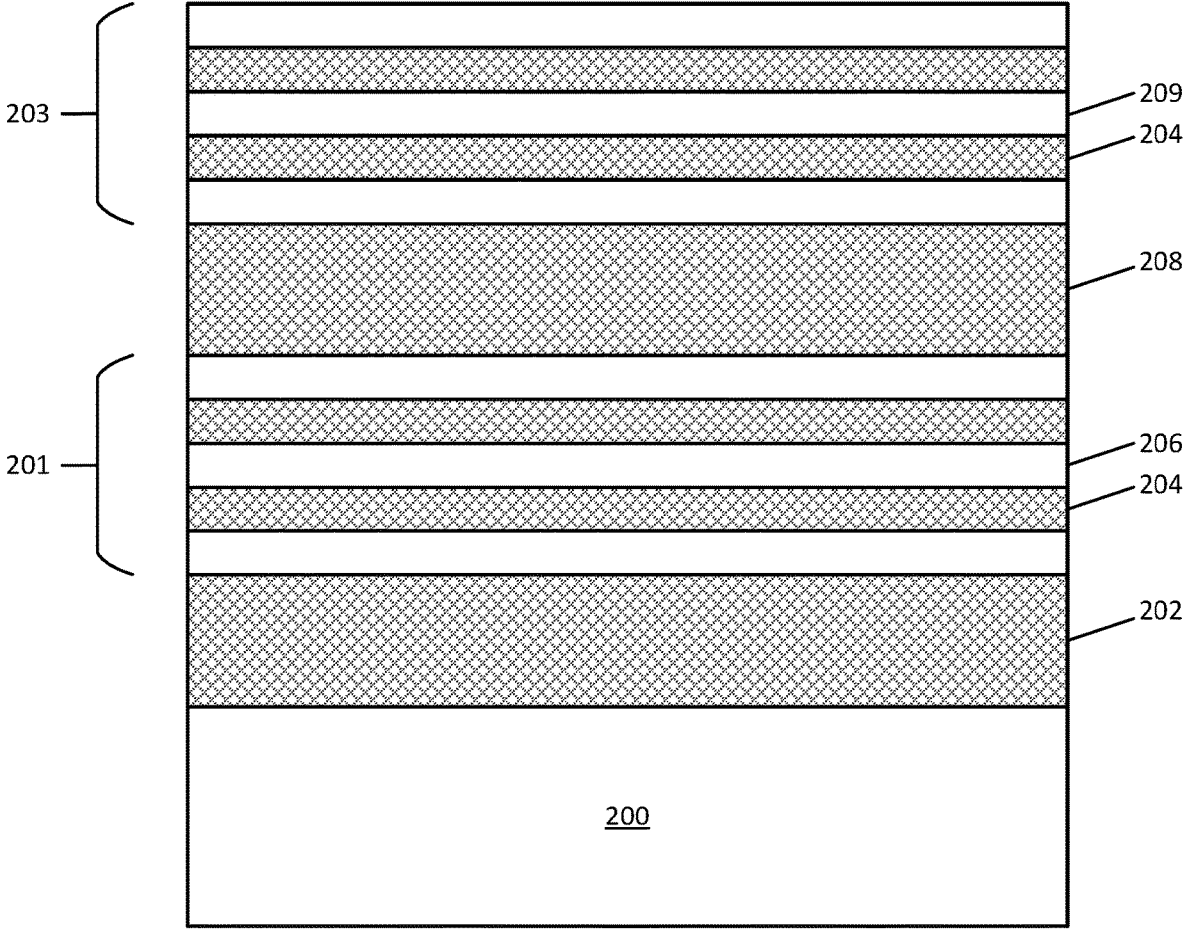
FIGS. 2A-2L are cross-sectional views that collectively illustrate an example process for forming a semiconductor device having a combined frontside and backside contact in the epi region, in accordance with some embodiments of the present disclosure.

FIG. 2A illustrates a cross-sectional view across a substrate 200 having a series of material layers deposited over it, according to an embodiment of the present disclosure. Substrate 200 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 200 can be a semiconductor-on-insulator substrate having a desired semiconductor layer over a buried insulator layer (e.g., silicon over silicon dioxide). Alternatively, substrate 200 can be a multilayer substrate or superlattice suitable for forming nanowires or nanoribbons (e.g., alternating layers of silicon and SiGe, or alternating layers indium gallium arsenide and indium phosphide). Any number of substrates can be used.

Alternating material layers may be deposited over substrate 200, including a first layer stack 201, a second layer stack 203, a first spacer layer 202 between first layer stack 201 and substrate 200, and a second spacer layer 208 between first layer stack 201 and second layer stack 203. Each of first and second layer stacks 201 and 203 includes sacrificial layers 204 alternating with other material layers, such as first semiconductor layers 206 of first layer stack 201 and second semiconductor layers 209 of second layer stack 203. Any number of alternating sacrificial layers 204 and material layers may be deposited within each of first layer stack 201 and second layer stack 203. Additionally, any number of layer stacks and spacer layers may be deposited over substrate 200. It should be noted that the cross section illustrated in FIG. 2A is taken along the length of a fin formed from the multiple alternating layers and extending up above the surface of substrate 200.

According to some embodiments, sacrificial layers 204 have a different material composition than each of first semiconductor layers 206 and second semiconductor layers 209. In some embodiments, sacrificial layers 204 are silicon germanium (SiGe) while each of first semiconductor layers 206 and second semiconductor layers 209 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 204 and first and second semiconductor layers 206 and 209, the germanium concentration is different between sacrificial layers 204 and first and second semiconductor layers 206 and 209. For example, sacrificial layers 204 may include a higher germanium content compared to first and second semiconductor layers 206 and 209. Each of first and second spacer layers 202 and 208 may include the same material as sacrificial layers 204. In some examples, spacer layers 202/208 can be any material that exhibits a high etch selectivity with the material of semiconductor layers 206 and 209.

While dimensions can vary from one example embodiment to the next, the thickness of each sacrificial layer 204 may be between about 5 nm and about 20 nm. In some embodiments, the thickness of each sacrificial layer 204 is substantially the same (e.g., within 1-2 nm) across each of first layer stack 201 and second layer stack 203. The thickness of each of first semiconductor layers 206 and second semiconductor layers 209 may be about the same as the thickness of each sacrificial layer 204 (e.g., about 5-20 nm). However, according to some embodiments, the thickness of first and second spacer layers 202/208 is thicker than any of sacrificial layers 204. First spacer layer 202 is provided to create a sufficient spacing between a bottom semiconductor device and substrate 200 while second spacer layer 208 is provided to create a sufficient spacing between the adjacent semiconductor devices to be formed from first semiconductor layers 206 and second semiconductor layers 209. While dimensions can vary from one example embodiment to the next, the thickness of first and second spacer layers 202/208 may be between about 10 nm to about 80 nm. Each of sacrificial layers 204, first semiconductor layers 206, second semiconductor layers 209, first spacer layer 202, and second spacer layer 208 may be deposited using any known material deposition technique, such as chemical vapor deposition (CVD), plasma-enhanced chemical vapor deposition (PECVD), physical vapor deposition (PVD), or atomic layer deposition (ALD).

First semiconductor layers 206 may be doped with either n-type dopants (to produce a p-channel transistor) or p-type dopants (to produce an n-channel transistor). Similarly, second semiconductor layers 209 may be doped with either n-type dopants (to produce a p-channel transistor) or p-type dopants (to produce an n-channel transistor).

Figure 2B:
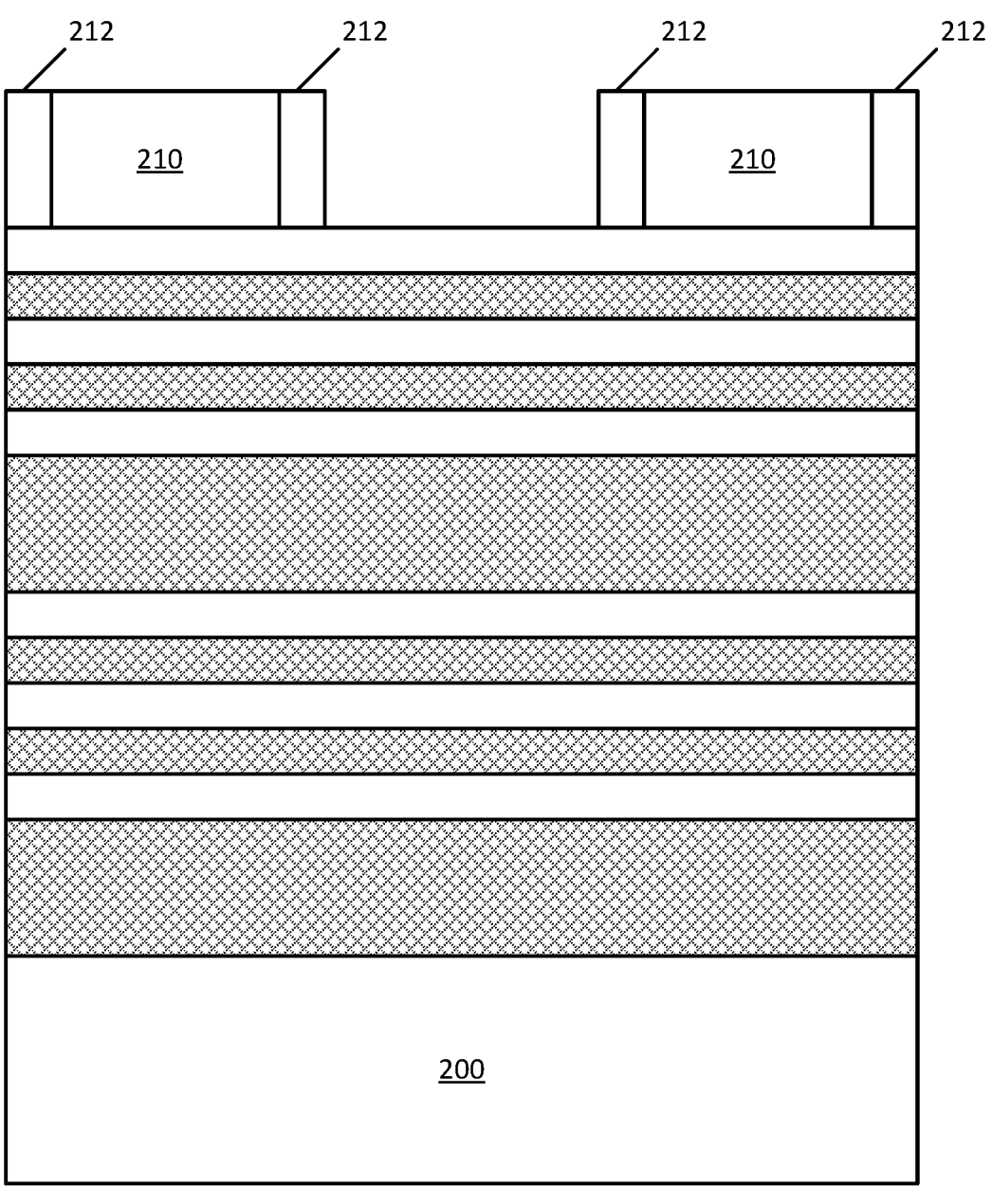

FIG. 2B illustrates a cross-sectional view of the structure shown in FIG. 2A following the formation of a sacrificial gate structures 210 and sidewall spacers 212 over the alternating layer structure of the fin, according to an embodiment. Sacrificial gate structures 210 may run in an orthogonal direction to the length of the fin and may include any material that can be safely removed later in the process without etching or otherwise damaging any portions of the fin or of spacer structures 212. In some embodiments, sacrificial gate structures 210 include polysilicon. Spacer structures 212 may be formed using an etch-back process where spacer material is deposited everywhere and then anisotropically etched to leave the material only on sidewalls of structures including sacrificial gate structures 210. Spacer structures 212 may include a dielectric material, such as silicon nitride, silicon oxy-nitride, or any formulation of those layers incorporating carbon or boron dopants. Each sacrificial gate structure 210 together with its associated spacer structures 212 define a portion of the fin that will be used to form a stack of transistor devices as discussed further herein.

Figure 2C:
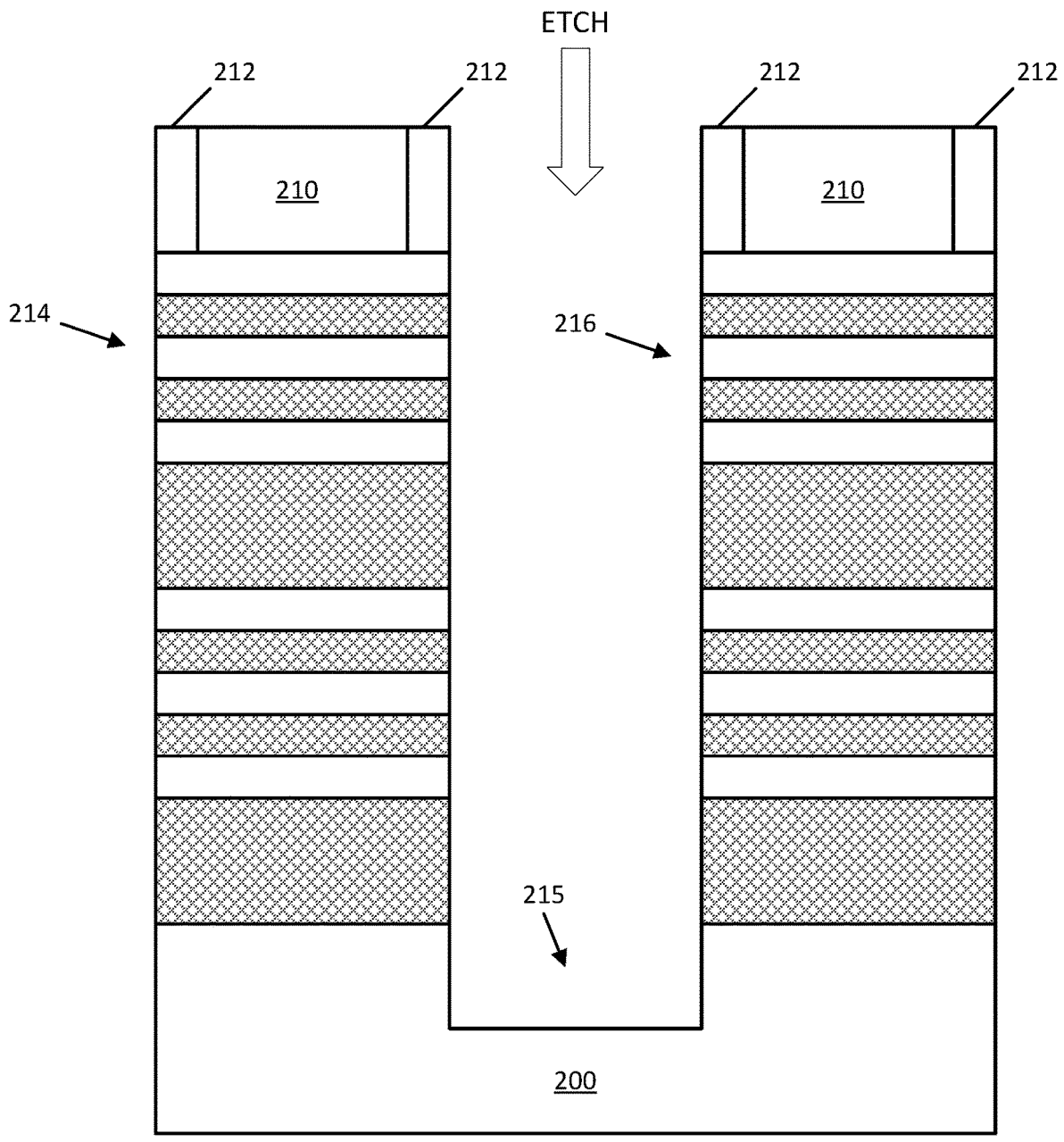

FIG. 2C illustrates a cross-sectional view of the structure shown in FIG. 2B following the removal of the exposed fin not under sacrificial gate structures 210 and sidewall spacers 212, according to an embodiment of the present disclosure. According to some embodiments, the various layers of the different layer stacks are etched at substantially the same rate using an anisotropic RIE process. As observed in FIG. 2C, the width of spacer structures 212 works to define the length of the resulting fins 214 and 216. In some embodiments, some undercutting occurs along the edges of the fins beneath spacer structures 212 such that the lengths of the fins are not exactly the same as a sum of the widths of spacer structures 212 and a width of a given sacrificial gate structure 210. According to some embodiments, the RIE process also etches through a portion of substrate 200 thus forming a recess 215 within substrate 200 adjacent to fins 214 and 216. Similar to the discussion related to FIG. 1, the discussion of the fabrication process herein will focus on fin 214 though the same processes may be occurring with fin 216.

Figure 2D:
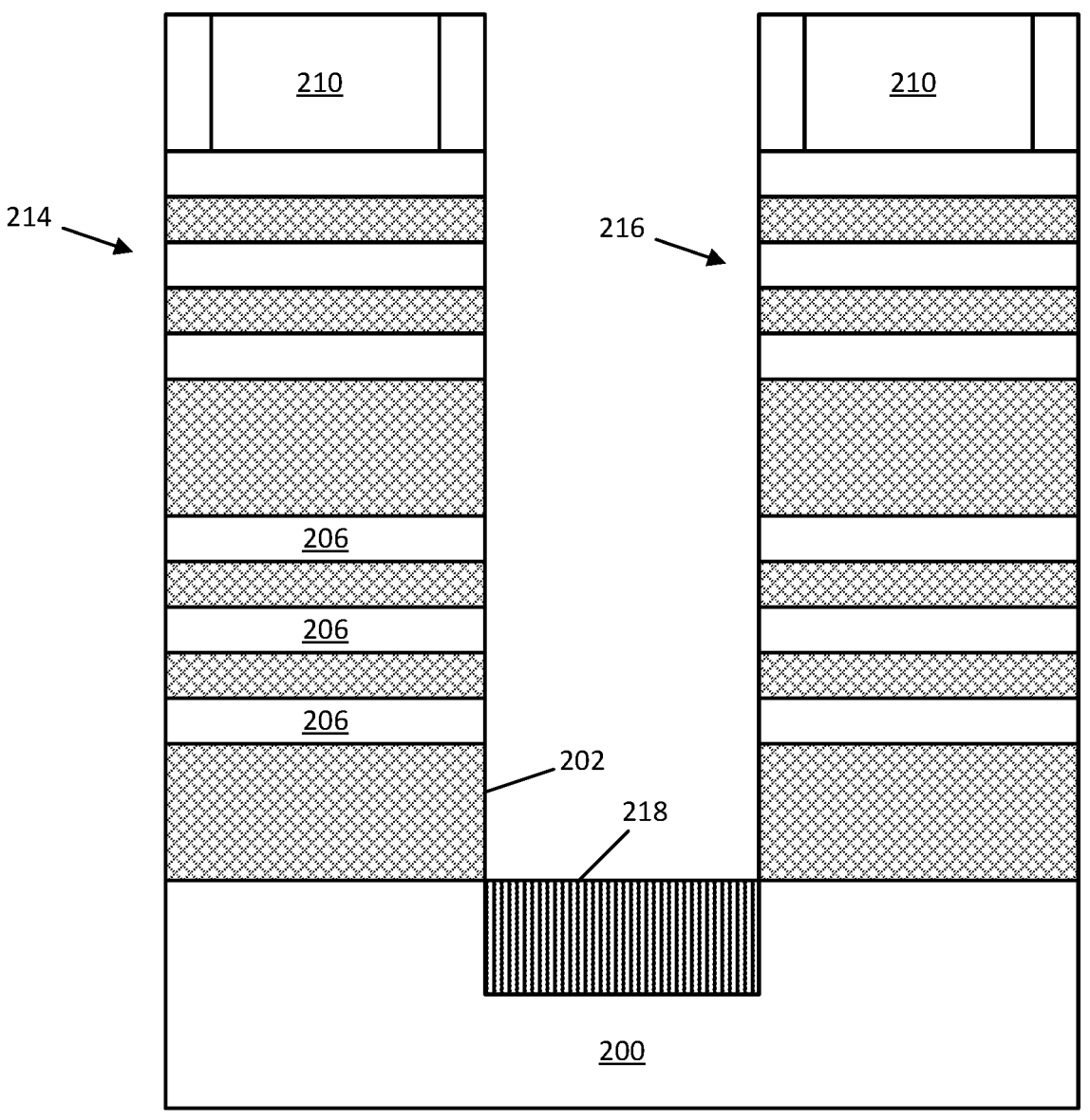

FIG. 2D illustrates a cross-sectional view of the structure shown in FIG. 2C following the formation of a sacrificial plug 218 within recess 215, according to an embodiment of the present disclosure. Sacrificial plug 218 may include any material that has a high degree of etch selectivity with the semiconductor material of substrate 200. In some examples, sacrificial plug 218 includes titanium nitride (TiN) or titanium oxide (TiO$_2$). According to some embodiments, sacrificial plug 218 is recessed to a given thickness such that a top surface of sacrificial plug 218 is beneath first spacer layer 202 or beneath a bottom-most semiconductor layer of first semiconductor layers 206.

Figure 2E:
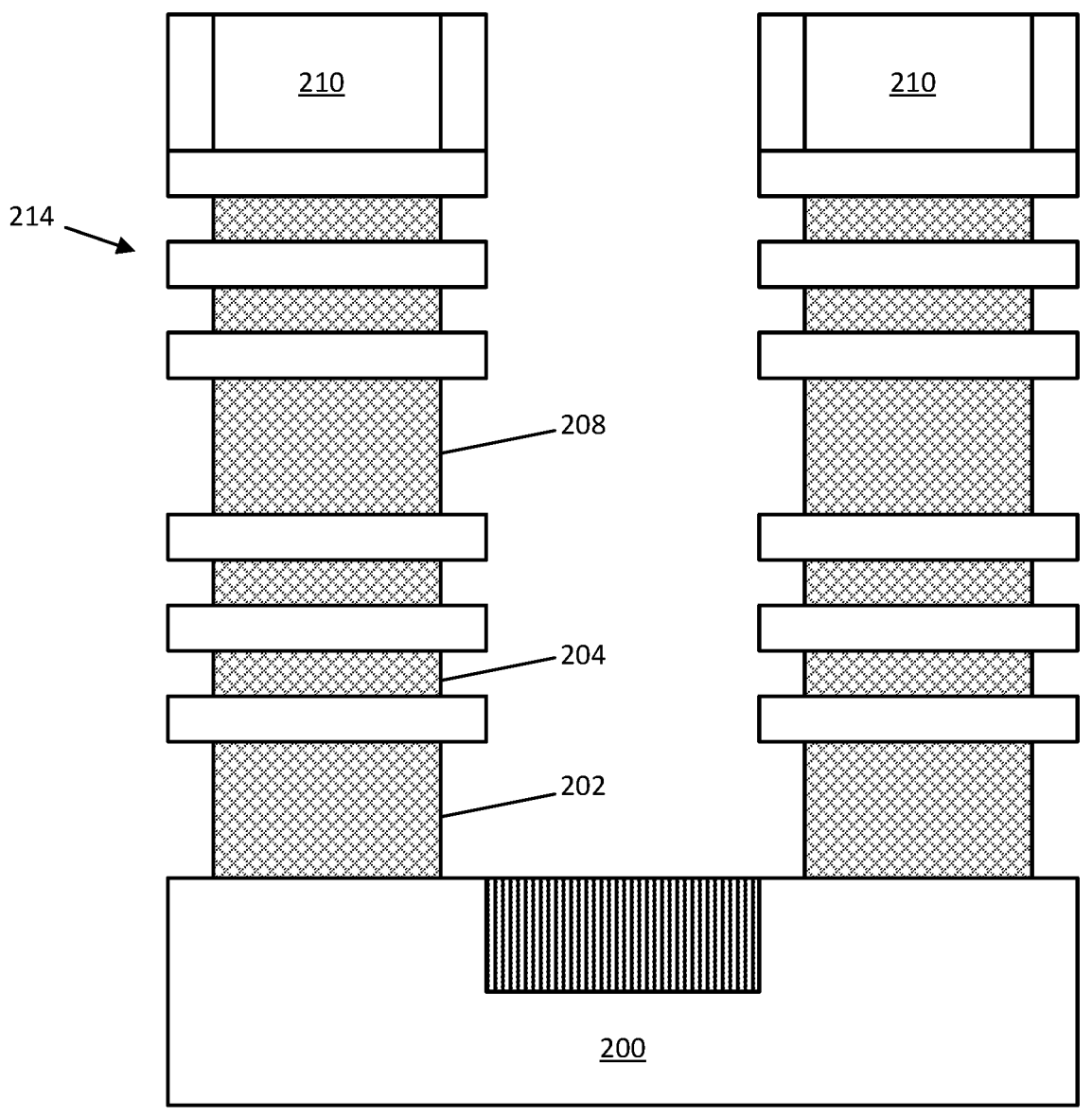

FIG. 2E illustrates a cross-sectional view of the structure shown in FIG. 2D following the removal of portions of sacrificial layers 204, according to an embodiment of the present disclosure. An isotropic etching process may be used to recess the exposed ends of each sacrificial layer 204 along the entire layer stack of fin 214. First and second spacer layers 202 and 208 may be recessed as well along with each sacrificial layer 204. The isotropic etchant used exhibits a high etch selectivity between sacrificial layers 204 and each of the semiconductor layers.

Figure 2F:
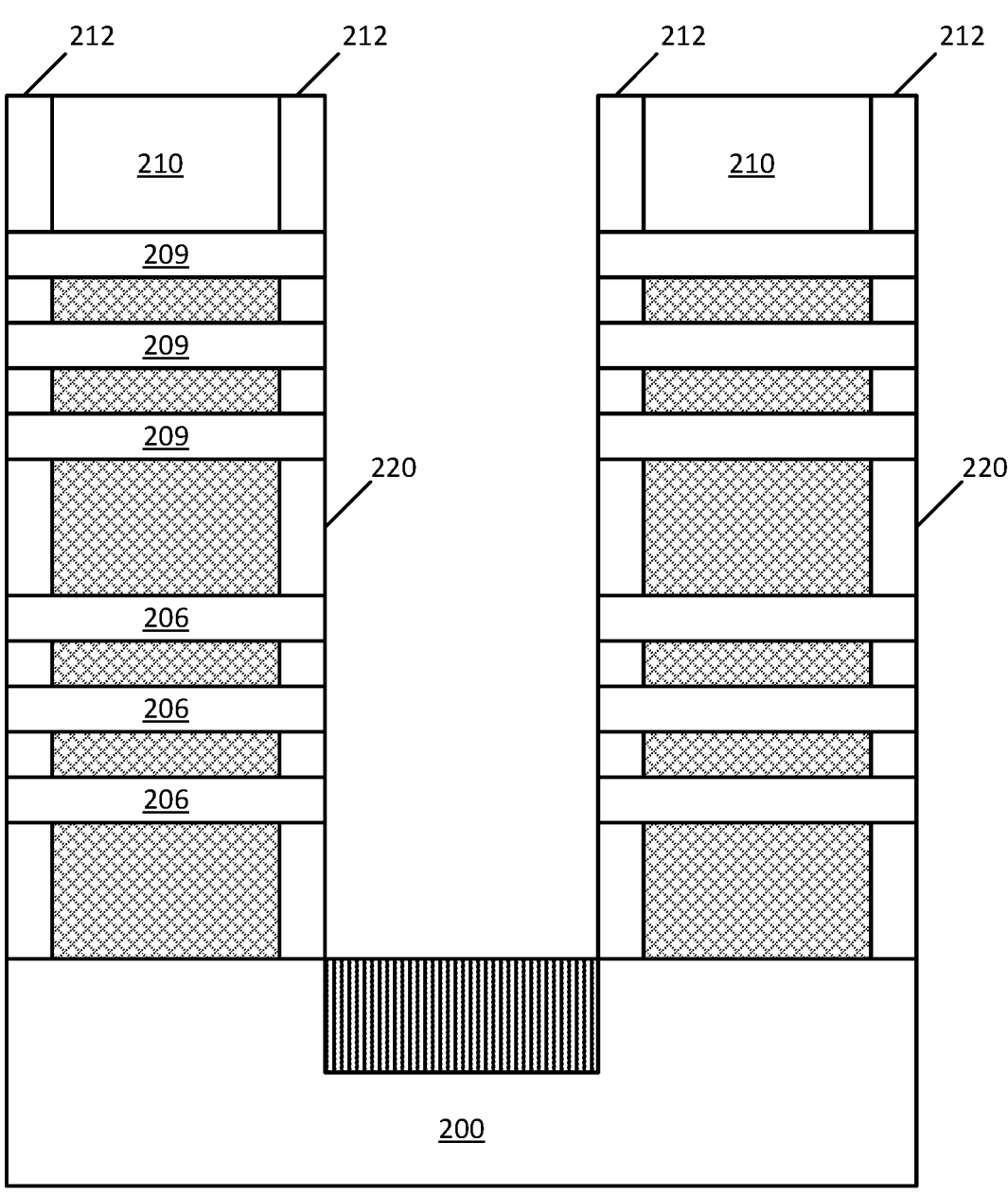

FIG. 2F illustrates a cross-sectional view of the structure shown in FIG. 2E following the formation of internal spacers 220, according to an embodiment of the present disclosure. Internal spacers 220 may have a material composition that is similar to or the exact same as spacer structures 212. Accordingly, internal spacers 220 may be any suitable dielectric material that exhibits high etch selectively to semiconductor materials such as silicon and/or silicon germanium. Internal spacers 220 may be conformally deposited over the sides of the fin structure using a CVD process like ALD. After the dielectric material has been deposited, an isotropic etching process is performed to remove internal spacers 220 from the tips of the semiconductor layers 206 and 209. According to some embodiments, internal spacers 220 are recessed inwards at least until the ends of both first semiconductor layers 206 and second semiconductor layers 209 are exposed.

Figure 2G:
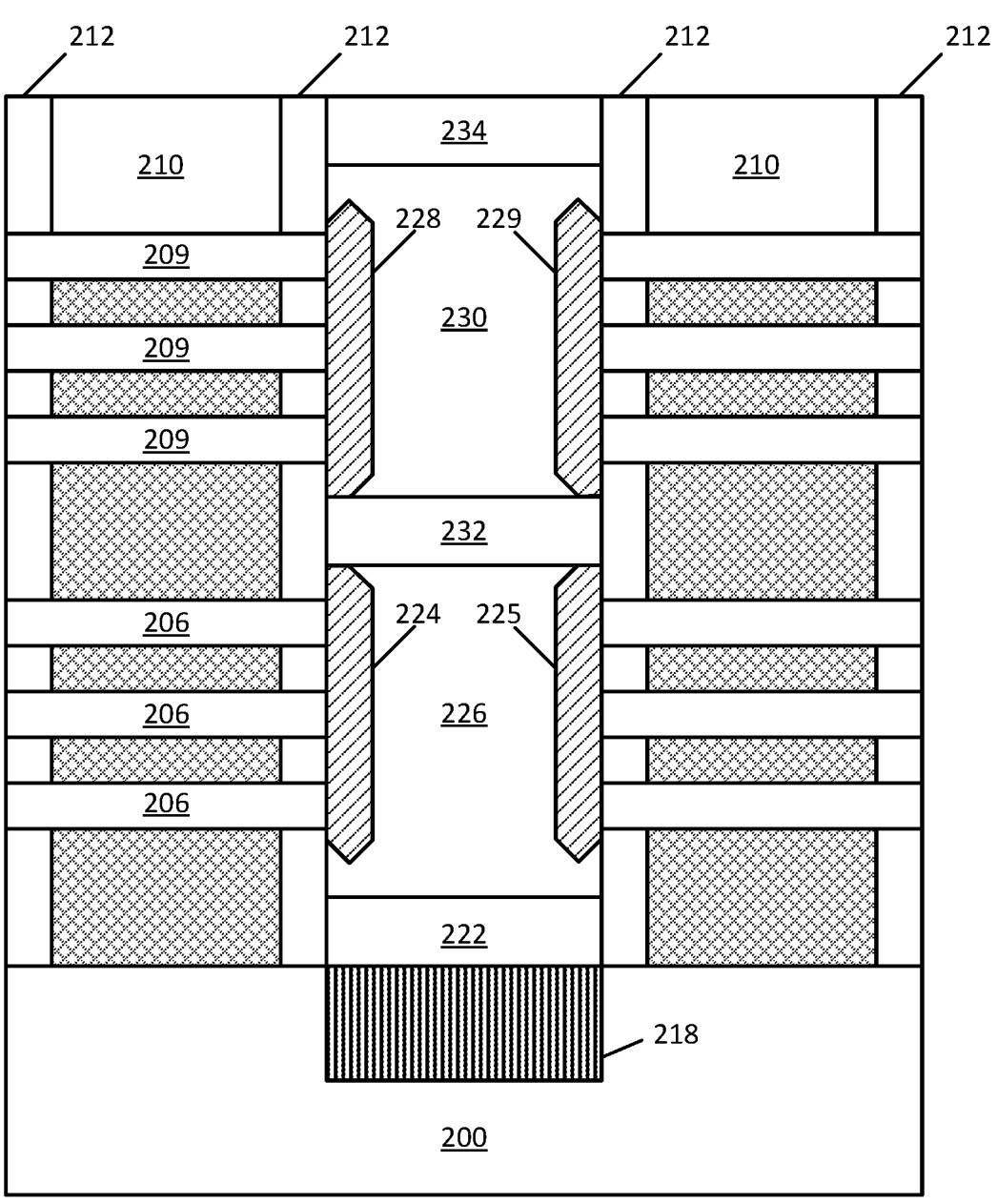

FIG. 2G illustrates a cross-sectional view of the structure shown in FIG. 2F following the formation of source and drain regions, according to an embodiment of the present disclosure. Due to the vertically stacked spacing between first semiconductor layers 206 and second semiconductor layers 209, a similarly stacked formation of source and drain regions is created. According to an embodiment, a bottom insulator layer 222 is first formed over sacrificial plug 218 to isolate the epitaxial source or drain regions from sacrificial plug 218 and/or substrate 200. Accordingly, bottom insulator layer 222 may be any suitable dielectric material.

A first source or drain region is formed adjacent to the ends of first semiconductor layers 206. As noted above, the first source or drain region may include first epitaxial portions 224 and 225 and a second epitaxial portion 226 over the first epitaxial portions. The first epitaxial portion 224 may be grown directly from the exposed ends of first semiconductor layers 206. Accordingly, in some embodiments, first epitaxial portion 224 represents nubs or islands of epitaxial growth on the ends of first semiconductor layers 206, where at least some of the nubs or islands are not merged together. In other embodiments, such as the one illustrated, first epitaxial portion 224 represents merged epitaxial growths from the ends of first semiconductor layers 206. According to some embodiments, second epitaxial portion 226 is formed over first epitaxial portions 224 and 225 and has a higher dopant concentration compared to first epitaxial portions 224 and 225. In the example of a PMOS device, first epitaxial portions 224 and 225 may be a semiconductor material (e.g., group IV and group III-V semiconductor materials) having a first dopant concentration of p-type dopants while second epitaxial portion 226 is a semiconductor material (e.g., group IV and group III-V semiconductor materials) having a second dopant concentration of p-type dopants that is higher than the first dopant concentration.

As noted above, first semiconductor layers 206 extend between the first source or drain region (made up of first epitaxial portions 224/225 and second epitaxial portion 226) and a second source or drain region that would be present on the left side of first semiconductor layers 206. A third source or drain region may be formed adjacent to the ends of second semiconductor layers 209, such that second semiconductor layers 209 extend between the third source or drain region and a fourth source or drain region that would be present on the left side of second semiconductor layers 209. Similar to the first source or drain region, the third source or drain region may include first epitaxial portions 228 and 229 and a second epitaxial portion 230 over the first epitaxial portions. The first epitaxial portion 228 may be grown directly from the exposed ends of second semiconductor layers 209. Accordingly, in some embodiments, first epitaxial portion 228 represents nubs or islands of epitaxial growth on the ends of second semiconductor layers 209, where at least some of the nubs or islands are not merged together. In other embodiments, such as the one illustrated, first epitaxial portion 228 represents merged epitaxial growths from the ends of second semiconductor layers 209. According to some embodiments, second epitaxial portion 230 is formed over first epitaxial portions 228 and 229 and has a higher dopant concentration compared to first epitaxial portions 228 and 229. In the example of an NMOS device, first epitaxial portions 228 and 229 may be a semiconductor material (e.g., group IV and group III-V semiconductor materials) having a first dopant concentration of n-type dopants while second epitaxial portion 230 is a semiconductor material (e.g., group IV and group III-V semiconductor materials) having a second dopant concentration of n-type dopants that is higher than the first dopant concentration.

According to some embodiments, another insulator layer 232 is formed between the first source or drain region and the third source or drain region to provide sufficient isolation between the regions. Insulator layer 232 may be any suitable dielectric material, such as the same material as bottom insulator layer 222. In some embodiments insulator layer 232 is a titanium-based dielectric. Insulator layer 232 may have a thickness between about 10 nm and about 30 nm. A top insulator layer 234 may also be formed over the third source or drain region (made up of first epitaxial portions 228/229 and second epitaxial portion 230). In some embodiments, a top surface of insulator layer 234 is planarized to be substantially level with a top surface of sacrificial gate structure 210. Polishing of the top surface of insulator layer 234 may be performed using chemical mechanical polishing, CMP.

Figure 2H:
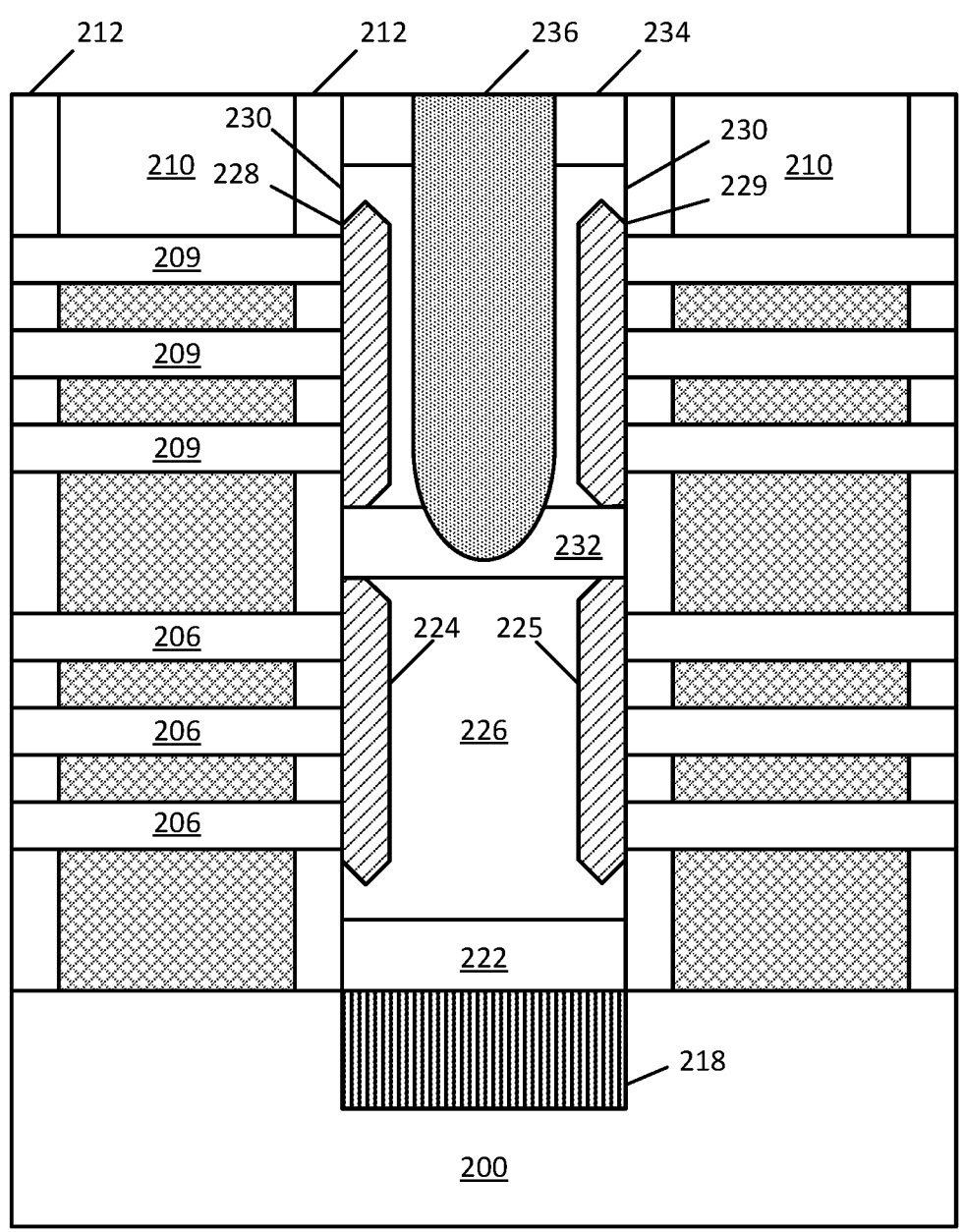

FIG. 2H illustrates a cross-sectional view of the structure shown in FIG. 2G following the formation of a frontside contact 236, according to an embodiment of the present disclosure. An anisotropic etching process, such as RIE, may be used to etch a recess through top insulator layer 234 and through a thickness of the third source or drain region. In some embodiments, the etched recess extends through an entire thickness of the third source or drain region and into at least a portion of insulator layer 232. The recess may extend into at least a portion of the first source or drain region, in some examples. According to some embodiments, the recess is aligned such that it does not expose any portion of the first epitaxial regions 228/229 of the third source or drain region. Thus, the recess may be formed only through second epitaxial portion 230 of the third source or drain region.

According to some embodiments, the etched recess is filled with a conductive material to form frontside contact 236. Due to the narrow etch profile, frontside contact 236 may have a tapered end. Frontside contact 236 may include any conductive material such as copper (Cu), ruthenium (Ru), tungsten (W), cobalt (Co), titanium (Ti), molybdenum (Mo), or any alloys thereof. In some embodiments, frontside contact 236 includes layers of different conductive materials, such as a liner that includes titanium silicide or nitrogen silicide and a fill material that includes tungsten or cobalt, to name a few examples. According to some embodiments where first epitaxial regions 228/229 represent individual nubs or islands of epitaxial growth from the ends of the semiconductor layers, frontside contact 236 does not contact at least one of the epitaxial nubs or islands of first epitaxial regions 228/229. In some examples, frontside contact 236 does not contact any of the epitaxial nubs or islands of first epitaxial regions 228/229. Depending on the depth of the etched recess, frontside contact 236 may extend through an entire thickness of the third source or drain region and into a portion of insulator layer 232, as illustrated. In some other embodiments, frontside contact 236 extends further into a portion of the first source or drain region, or does not extend into any portion of insulator layer 232. A top surface of frontside contact 236 may be polished using, for example, CMP to planarize the top surface along with the top surface of sacrificial gate structure 210.

Figure 2I:
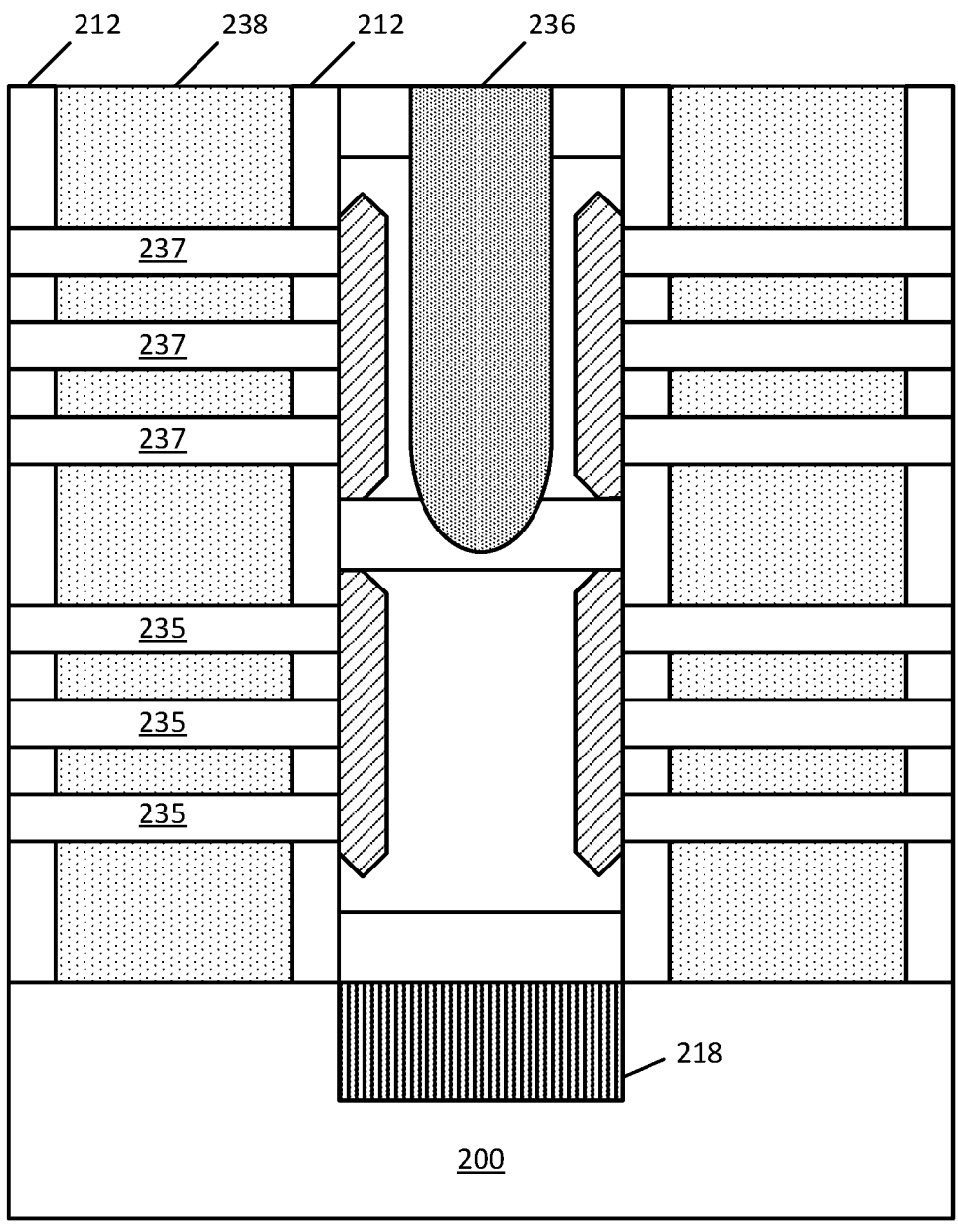

FIG. 2I illustrates a cross-sectional view of the structure shown in FIG. 2H following the removal of the sacrificial gate structure 210 and sacrificial layers 204 and the formation of a gate structure 238, according to an embodiment of the present disclosure. Sacrificial gate structure 210 may be removed using any wet or dry isotropic process thus exposing the alternating layer stack of the fin within the trench left behind after the removal of sacrificial gate structure 210. Once sacrificial gate structure 210 has been removed, sacrificial layers 204 (along with spacer layers 202 and 208) may also be removed using a selective isotropic etching process that removes the material of sacrificial layers 204 (along with spacer layers 202 and 208) but does not remove (or removes very little of) first semiconductor layers 206 and second semiconductor layers 209. At this point, the suspended (sometimes called released) first semiconductor layers 206 form first nanoribbons 235 that extend between the first source or drain region and the second source or drain region, and the suspended second semiconductor layers 209 form second nanoribbons 237 that extend between the third source or drain region and the fourth source or drain region.

As noted above, gate structure 238 includes a gate dielectric and a gate electrode. The gate dielectric may be conformally deposited around first nanoribbons 235 and second nanoribbons 237 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, molybdenum nitride, niobium nitride, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second nanoribbons 235/237, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Recall the workfunction layers formed around first nanoribbons 235 can be different from the workfunction layers formed around second nanoribbons 237, according to some example embodiments.

Figure 2J:
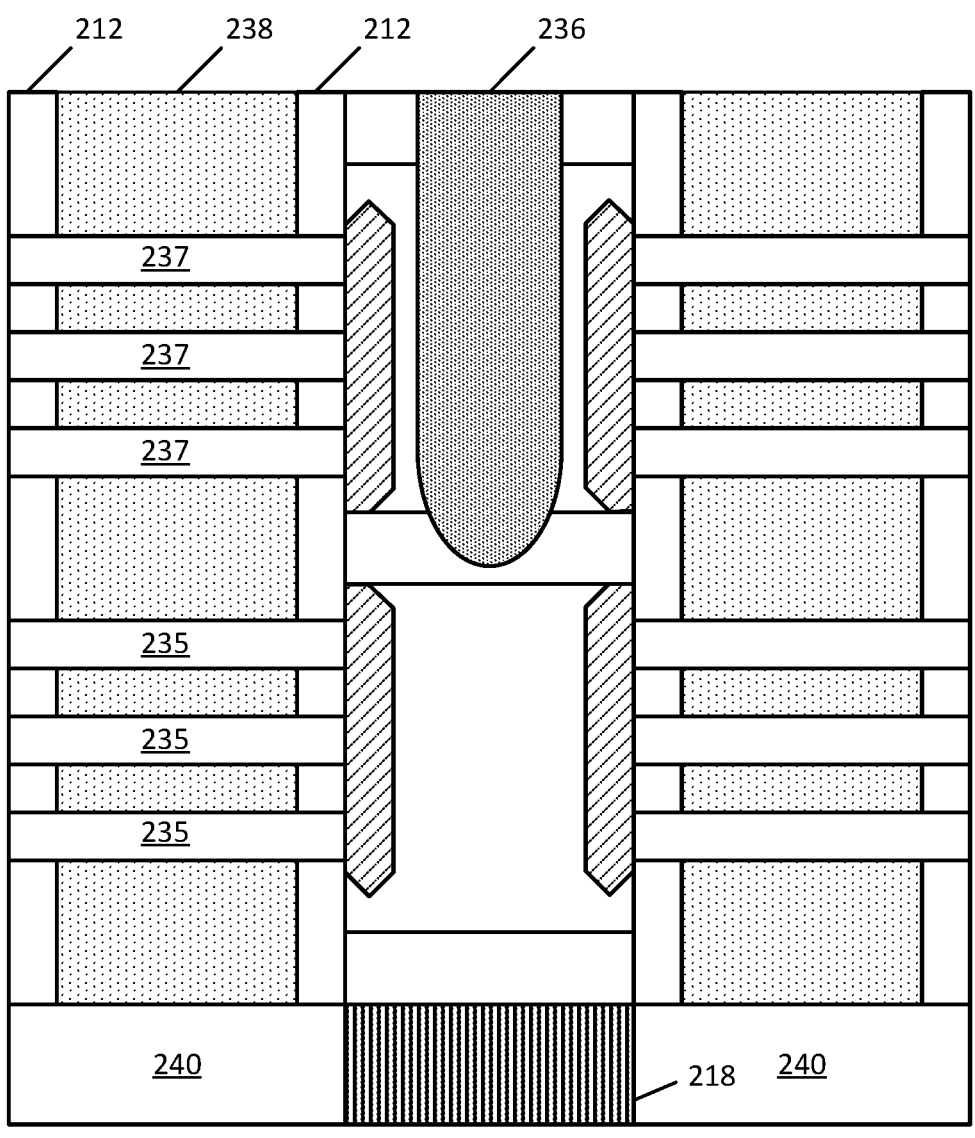

FIG. 2J illustrates a cross-sectional view of the structure shown in FIG. 2I following the removal of substrate 200 and the formation of base dielectric layer 240, according to an embodiment of the present disclosure. Following the formation of various front-side contacts and interconnects (e.g., FEOL structures), a bulk portion of substrate 200 is removed until sacrificial plug 218 is exposed from the backside, according to some embodiments. The bulk portion of substrate 200 may be removed using, for example, CMP and/or vapor phase etchants. According to some embodiments, once substrate 200 has been thinned to about the same thickness as sacrificial plug 218, the remaining portion of substrate 200 coplanar with sacrificial plug 218 is removed using, for example, an isotropic etching process. This leaves sacrificial plug 218 extending outward from the backside of the device. A dielectric material may then be deposited over and around sacrificial plug 218 and polished back to once again expose sacrificial plug 218 and form base dielectric layer 240. As noted above, any suitable dielectric material may be used for base dielectric layer 240, with some examples including silicon dioxide, aluminum oxide, or silicon oxycarbonitride.

Figure 2K:
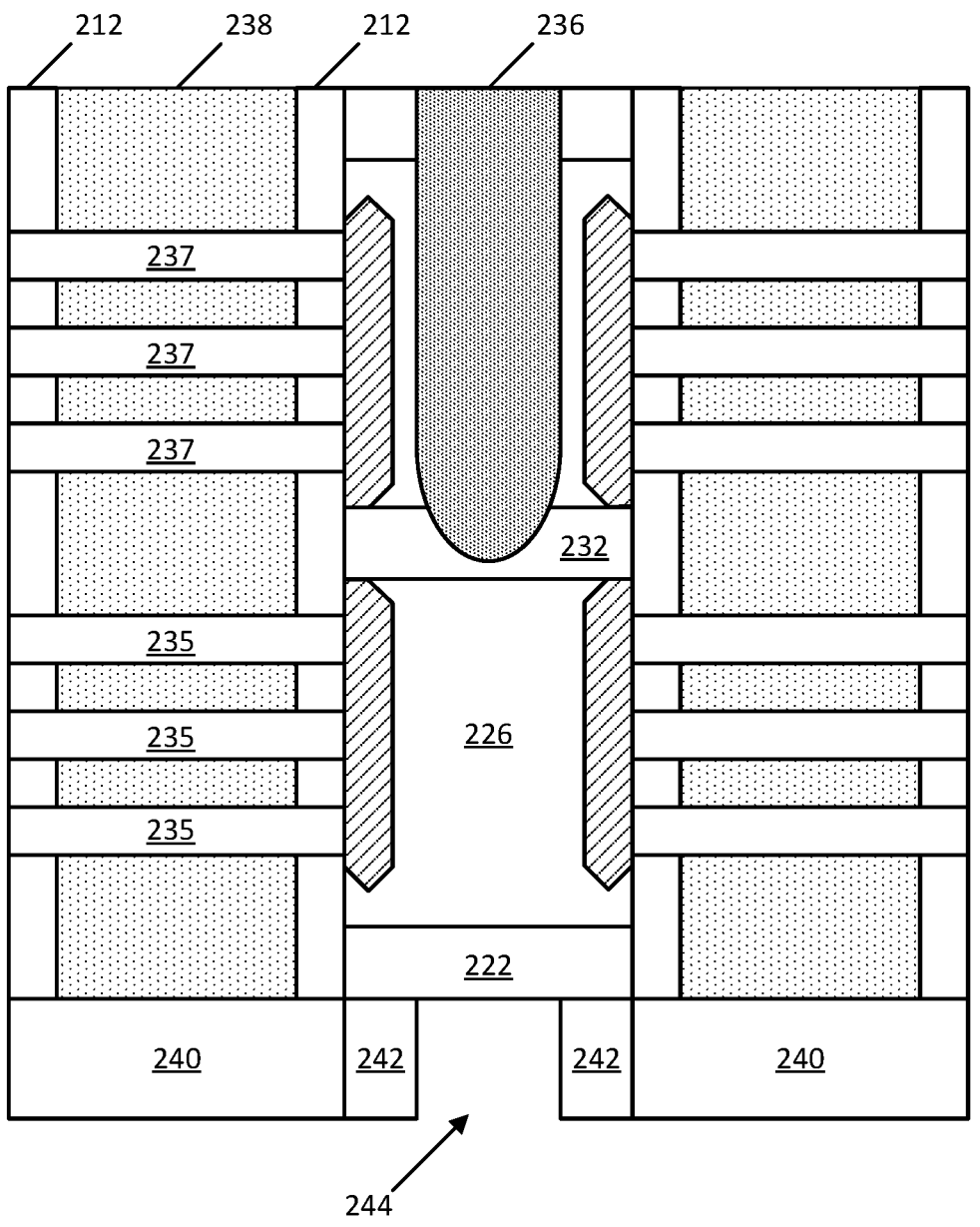

FIG. 2K illustrates a cross-sectional view of the structure shown in FIG. 2J following the removal of sacrificial plug 218 from the backside, according to an embodiment of the present disclosure. Sacrificial plug 218 may be removed using any isotropic etchant to selectively remove the material of sacrificial plug 218 as opposed to the surrounding dielectric material from base dielectric layer 240 and/or bottom insulator layer 222. Depending on the width of sacrificial plug 218, dielectric spacers 242 may be formed within the recess 244 left behind following the removal of sacrificial plug 218. Dielectric spacers 242 may be conformally deposited on the backside of the integrated circuit and then etched back to leave them primary on the sidewalls of recess 244. Dielectric spacers 242 may be used to define a smaller width for recess 244, which can ultimately define a narrower etch profile through the first source or drain region. Dielectric spacers 242 may be any suitable dielectric layer, and may include the same dielectric material as base dielectric layer 240.

Figure 2L:
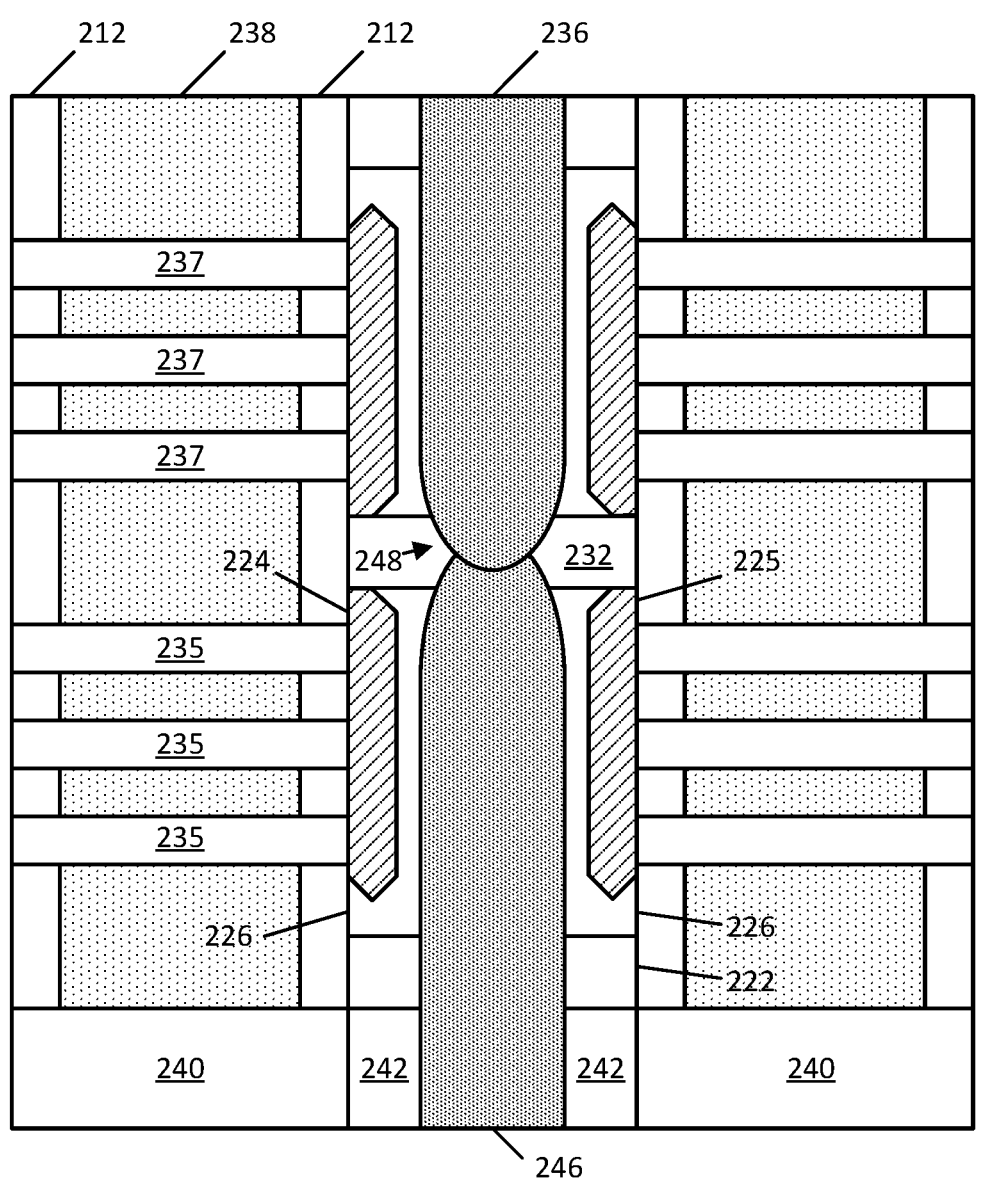

FIG. 2L illustrates a cross-sectional view of the structure shown in FIG. 2K following the formation of a backside contact 246, according to an embodiment of the present disclosure. An anisotropic etching process, such as RIE, may be used to etch a recess from the backside through the opening between dielectric spacers 242, through a thickness of bottom insulator layer 222 and through a thickness of the first source or drain region. In some embodiments, the etched recess extends through an entire thickness of the first source or drain region and into at least a portion of insulator layer 232. The recess may also extend into at least a portion of the third source or drain region, in some examples. According to some embodiments, the backside recess is made deep enough such that it exposes at least a portion of frontside contact 236, such as at least the end tip of frontside contact 236. Accordingly, depending on the depth of frontside contact 236, the backside recess may be made through an entire thickness of the first source or drain region, only a portion of the first source or drain region, or through a portion of the third source or drain region.

According to some embodiments, the backside recess is aligned such that it does not expose any portion of the first epitaxial regions 224/225 of the first source or drain region. Thus, the recess may be formed only through second epitaxial portion 226 of the first source or drain region.

According to some embodiments, the etched backside recess is filled with a conductive material to form backside contact 246. Due to the narrow etch profile, backside contact 246 may have a tapered end that contacts the tapered end of frontside contact 236. Backside contact 246 may include any conductive material such as copper (Cu), ruthenium (Ru), tungsten (W), cobalt (Co), titanium (Ti), molybdenum (Mo), or any alloys thereof. In some embodiments, backside contact 246 has the same material composition and/or same layer structure as frontside contact 236. According to some embodiments where first epitaxial regions 224/225 represent individual nubs or islands of epitaxial growth from the ends of the semiconductor layers, backside contact 246 does not contact at least one of the epitaxial nubs or islands of first epitaxial regions 224/225. In some examples, backside contact 246 does not contact any of the epitaxial nubs or islands of first epitaxial regions 224/225. Depending on the depth of the etched recess, backside contact 246 may extend through an entire thickness of the third source or drain region and into a portion of insulator layer 232, as illustrated. In some other embodiments, backside contact 246 extends further into a portion of the third source or drain region where it contacts frontside contact 236, or only extends partially through the first source or drain region where it contacts frontside contact 236. A bottom surface of backside contact 246 may be polished using, for example, CMP to planarize the bottom surface along with the bottom surface of base dielectric layer 240.

According to some embodiments, a divot or recess 248 exists at a region where frontside contact 236 contacts backside contact 246. Divot or recess 248 may be formed due to the tapered end profile of each of frontside contact 236 and backside contact 246. Depending on the depth of frontside contact 236 (or backside contact 246), divot or recess 248 may be present within insulator layer 232, above insulator layer 232 (e.g. within the third source or drain region), or below insulator layer 232 (e.g., within the third source or drain region).

Figure 3:
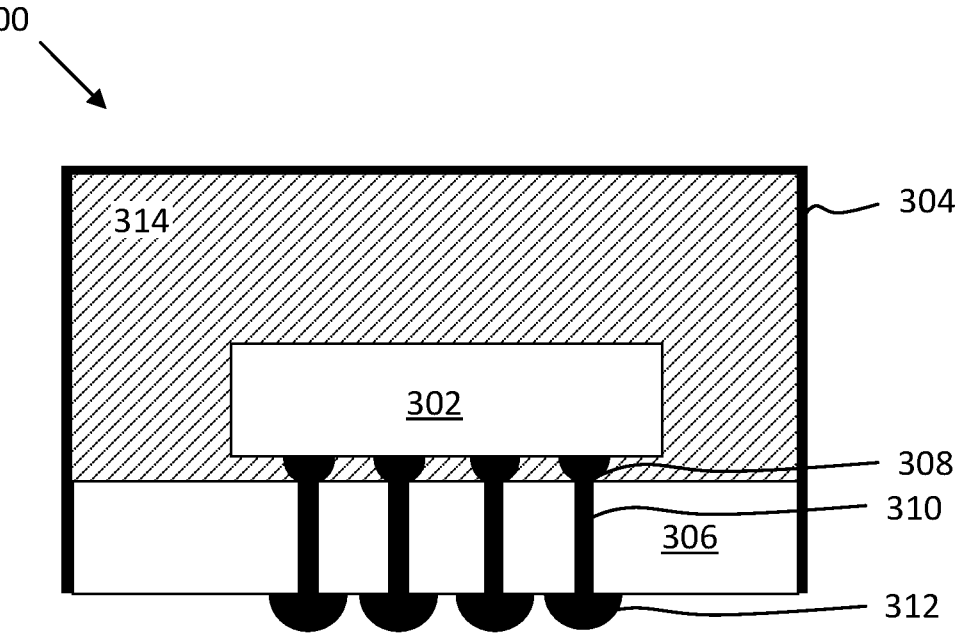
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

FIG. 4 is a flow chart of a method 400 for forming at least a portion of an integrated circuit, according to an embodiment. Various operations of method 400 may be illustrated in FIGS. 2A-2L. However, the correlation of the various operations of method 400 to the specific components illustrated in the aforementioned figures is not intended to imply any structural and/or use limitations. Rather, the aforementioned figures provide some example embodiments of method 400. Other operations may be performed before, during, or after any of the operations of method 400. Some of the operations of method 400 may be performed in a different order than the illustrated order.

Method 400 begins with operation 402 where a first section of a fin is formed having alternating first and second layers. The first layers may be sacrificial layers (e.g., comprising SiGe) while the second layers include a semiconductor material (e.g., Si, SiGe, Ge, InP, or GaAs) suitable for use as a nanoribbon channel. The first section may be formed over a substrate or over a sacrificial spacer layer. The thickness of each of the first and second layers may be between about 5 nm and about 20 nm or between about 5 nm and about 10 nm. Each of the first and second layers may be deposited using any known material deposition technique, such as CVD, PECVD, PVD, or ALD.

Method 400 continues with operation 404 where a second section of the fin is formed having alternating third and fourth layers. The third layers may be substantially the same as the first layers (sacrificial layers) with substantially the same thickness of the first layers. The fourth layers include a semiconductor material (e.g., Si, SiGe, Ge, InP, or GaAs) suitable for use as a nanoribbon channel and may include substantially the same material composition as the second layers. The thickness of each of the third and fourth layers may be between about 5 nm and about 20 nm or between about 5 nm and about 10 nm. Each of the third and fourth layers may be deposited using any known material deposition technique, such as CVD, PECVD, PVD, or ALD. According to some embodiments, the second fin section is separated from the first fin section by a sacrificial spacer layer that includes the same material composition as any of the first and third layers.

According to some embodiments, once the material layers have been deposited, one or more fins may be defined via an anisotropic etching process, such as RIE, using a patterned mask material to protect the fins from the etch. The fin height may include the alternating material layers of each of the fin sections and a subfin portion formed from the substrate material. In some other embodiments, trenches are first formed in a dielectric material and the alternating material layers of the aforementioned sections are formed within the trenches to form one or more multilayer fins. A separate fin used to define specific semiconductor devices may be further formed by patterning a sacrificial gate and gate spacer structures on sidewalls of the sacrificial gate that extend over the fin and removing portions of the fin outside of the sacrificial gate and gate spacer structures.

Method 400 continues with operation 406 where a sacrificial plug is formed within a portion of the substrate and adjacent to the fin. The sacrificial plug may include any material that has a high degree of etch selectivity with the semiconductor material of the substrate. In some examples, the sacrificial plug includes titanium nitride (TiN) or titanium oxide ($TiO_2$). According to some embodiments, the sacrificial plug is formed within a recess through a portion of the substrate adjacent to the fin. In some examples, a top surface of the sacrificial plug is coplanar with a top surface of the substrate.

Method 400 continues with operation 408 where a first source or drain region is formed that is coupled to at least the ends of the second layers of the first fin section. At least a portion of the first source or drain region may be epitaxially grown from exposed tips of the second layers (e.g., grown from semiconductor seed material), while an internal dielectric spacer material fills a region between the second layers and adjacent to the ends of the second layers. In some embodiments, the first source or drain region includes an epitaxial fill material of a more highly doped semiconductor material compared to the semiconductor material grown from the ends of the second layers. An insulator layer may be formed over the first source or drain region to isolate the first source or drain region from any additional epitaxial regions formed above it.

Method 400 continues with operation 410 where a second source or drain region is formed that is coupled to at least the ends of the fourth layers of the second fin section. At least a portion of the second source or drain region may be epitaxially grown from exposed tips of the fourth layers (e.g., grown from semiconductor seed material), while the internal dielectric spacer material fills a region between the fourth layers and adjacent to the ends of the fourth layers. In some embodiments, the second source or drain region includes an epitaxial fill material of a more highly doped semiconductor material compared to the semiconductor material grown from the ends of the fourth layers.

Method 400 continues with operation 412 where a first conductive contact is formed that extends down through the second source or drain region towards the first source or drain region. In some embodiments, the first conductive contact extends through an entire thickness of the second source or drain region (stopping within a thickness of the insulator layer between the first and second source or drain regions). In some embodiments, the first conductive contact extends through a thickness of both the second source or drain region and the insulator layer (stopping within a thickness of the first source or drain region). The first conductive contact may have a tapered profile and may include any suitably conductive material such as copper (Cu), ruthenium (Ru), tungsten (W), cobalt (Co), titanium (Ti), molybdenum (Mo), or any alloys thereof. In some embodiments, the first conductive contact includes layers of different conductive materials, such as a liner that includes titanium silicide or nitrogen silicide and a fill material that includes tungsten or cobalt, to name a few examples.

Method 400 continues with operation 414 where the sacrificial plug is removed from the backside. Once all frontside processing has been performed (including the formation of any FEOL interconnect structures), a bulk portion of the substrate is removed until the sacrificial plug is exposed from the backside, according to some embodiments. The bulk portion of the substrate may be removed using, for example, CMP and/or vapor phase etchants. Any remaining portion of the substrate that is coplanar with the sacrificial plug may be removed using, for example, an isotropic etching process and refilled with a base dielectric layer around the sacrificial plug. As noted above, any suitable dielectric material may be used for the base dielectric layer, with some examples including silicon dioxide, aluminum oxide, or silicon oxycarbonitride. The material of the sacrificial plug may then be removed using any isotropic etchant to selectively remove the material of the sacrificial plug as opposed to the surrounding dielectric material from the base dielectric layer. Removing the sacrificial plug leaves behind a backside recess that is aligned beneath the first source or drain region.

Method 400 continues with operation 416 where a second conductive contact is formed from the backside extending through at least a portion of the first source or drain region. The second conductive contact may be formed through the backside recess and through the first source or drain region such that is ultimately contacts the first conductive contact. Depending on the depth of the first conductive contact, the second conductive contact may contact the first conductive contact within the insulator layer, within the second source or drain region, or within the first source or drain region. The second conductive contact may include the same conductive material and/or layer structure as the first conductive contact or may include any other suitable conductive material. According to some embodiments, second conductive contact also includes a tapered end such that the tapered end of the second conductive contact makes contact with the tapered end of the first conductive contact.

Example System

Figure 5:
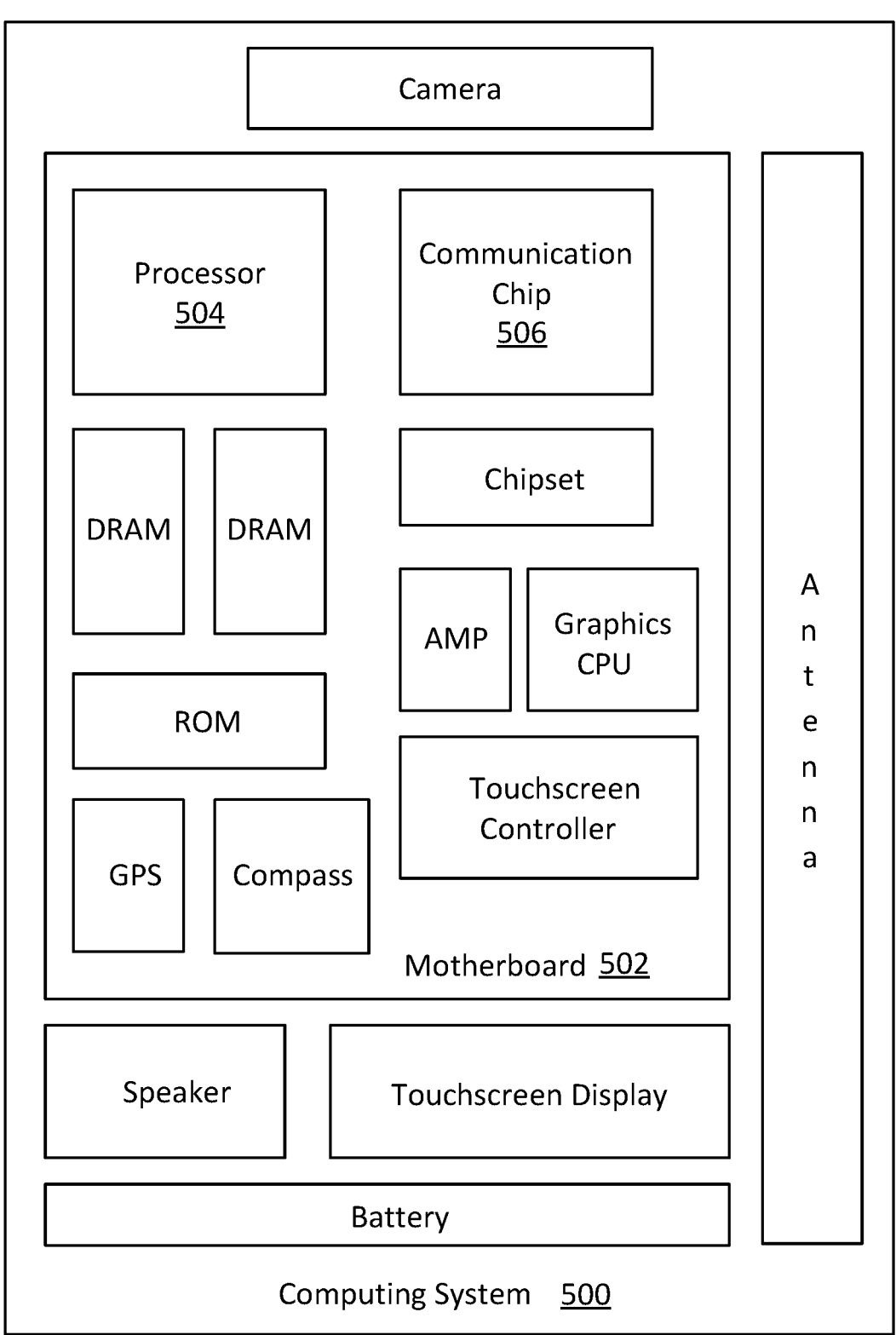
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit device on a substrate, the substrate having a stacked configuration of semiconductor devices, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having one or more first semiconductor bodies extending in a first direction between a first source or drain region and a second source or drain region, and a second semiconductor device having one or more second semiconductor bodies extending in the first direction between a third source or drain region and a fourth source or drain region. The one or more first semiconductor bodies are spaced vertically from the one or more second semiconductor bodies in a second direction different from the first direction, and the third source or drain region is spaced vertically from the first source or drain region in the second direction. The integrated circuit also includes an insulating layer between the first source or drain region and the third source or drain region, a first conductive contact extending through the first source or drain region in the second direction, and a second conductive contact extending through the third source or drain region in the second direction. The second conductive contact directly contacts the first conductive contact.

Example 2 includes the subject matter of Example 1, wherein the one or more first semiconductor bodies and the one or more second semiconductor bodies are nanoribbons or nanosheets that comprise germanium, silicon, or both silicon and germanium.

Example 3 includes the subject matter of Example 1 or 2, wherein the one or more first semiconductor bodies is n-type silicon and the one or more second semiconductor bodies is p-type silicon.

Example 4 includes the subject matter of any one of Examples 1-3, wherein a vertical distance between the one or more first semiconductor bodies and the one or more second semiconductor bodies is between about 10 nm and about 80 nm.

Example 5 includes the subject matter of any one of Examples 1-4, wherein the first conductive contact extends through an entire thickness of the first source or drain region in the second direction, and the second conductive contact extends through an entire thickness of the third source or drain region in the second direction.

Example 6 includes the subject matter of any one of Examples 1-5, wherein the first source or drain region includes one or more first regions that contact corresponding one or more first semiconductor bodies and a second region that contacts each of the one or more first regions, where the second region has a higher dopant concentration than each of the one or more first regions.

Example 7 includes the subject matter of Example 6, wherein the first conductive contact extends through the second region and does not contact at least one of the one or more first regions.

Example 8 includes the subject matter of Example 7, wherein the first conductive contact does not contact any of the one or more first regions.

Example 9 includes the subject matter of any one of Examples 6-8, wherein the third source or drain region includes one or more third regions that contact corresponding one or more second semiconductor bodies and a fourth region that contacts each of the one or more third regions, where the fourth region has a higher dopant concentration than each of the one or more third regions.

Example 10 includes the subject matter of Example 9, wherein the second conductive contact extends through the fourth region and does not contact at least one of the one or more third regions.

Example 11 includes the subject matter of Example 10, wherein the second conductive contact does not contact any of the one or more third regions.

Example 12 includes the subject matter of any one of Examples 1-11, wherein the first conductive contact has a tapered end and the second conductive contact as a tapered end, such that the tapered end of the first conductive contact directly contacts the tapered end of the second conductive contact.

Example 13 includes the subject matter of any one of Examples 1-12, wherein the first conductive contact and the second conductive contact each include: (1) a continuous body of conductive material; and (2) one or more layers at the periphery of the continuous body, the one or more layers including a metal.

Example 14 includes the subject matter of any one of Examples 1-12, wherein the first conductive contact and the second conductive contact include a continuous body of conductive material and one or more layers at the periphery of the continuous body, the continuous body of conductive material extending from the first source or drain region to the third source or drain region, and the one or more layers including a metal.

Example 15 includes the subject matter of Example 13 or 14, wherein the continuous body of conductive material includes tungsten, ruthenium, molybdenum, or cobalt, and the metal of one or more layers at the periphery of the continuous body includes titanium and/or tantalum.

Example 16 is a printed circuit board comprising the integrated circuit of any one of Examples 1-15.

Example 17 is an electronic device that includes a chip package comprising one or more dies. At least one of the one or more dies includes a first semiconductor device having one or more first semiconductor nanoribbons extending in a first direction between a first source or drain region and a second source or drain region, and a second semiconductor device having one or more second semiconductor nanoribbons extending in the first direction between a third source or drain region and a fourth source or drain region. The one or more first semiconductor nanoribbons are spaced vertically from the one or more second semiconductor nanoribbons in a second direction different from the first direction, and the third source or drain region is spaced vertically from the first source or drain region in the second direction. The integrated circuit also includes an insulating layer between the first source or drain region and the third source or drain region, and a conductive contact extending through an entire thickness of the first source or drain region in the second direction, an entire thickness of the insulating layer in the second direction, and an entire thickness of the third source or drain region in the second direction.

Example 18 includes the subject matter of Example 17, wherein the one or more first semiconductor nanoribbons and the one or more second semiconductor nanoribbons comprise germanium, silicon, or any combination thereof.

Example 19 includes the subject matter of Example 17 or 18, wherein the one or more first semiconductor nanoribbons is n-type silicon and the one or more second semiconductor nanoribbons is p-type silicon.

Example 20 includes the subject matter of any one of Examples 17-19, wherein a vertical distance between the one or more first semiconductor nanoribbons and the one or more second semiconductor nanoribbons is between about 10 nm and about 80 nm.

Example 21 includes the subject matter of any one of Examples 17-20, wherein the first source or drain region includes one or more first regions that contact corresponding first semiconductor nanoribbons and a second region that contacts each of the one or more first regions, where the second region has a higher dopant concentration than each of the one or more first regions.

Example 22 includes the subject matter of Example 21, wherein the conductive contact extends through the second region and does not contact at least one of the one or more first regions.

Example 23 includes the subject matter of Example 22, wherein the conductive contact does not contact any of the one or more first regions.

Example 24 includes the subject matter of any one of Examples 21-23, wherein the third source or drain region includes one or more third regions that contact corresponding second semiconductor nanoribbons and a fourth region that contacts each of the one or more third regions, where the fourth region has a higher dopant concentration than each of the one or more third regions.

Example 25 includes the subject matter of Example 24, wherein the conductive contact extends through the fourth region and does not contact at least one of the one or more third regions.

Example 26 includes the subject matter of Example 25, wherein the conductive contact does not contact any of the one or more third regions.

Example 27 includes the subject matter of any one of Examples 17-26, further comprising a printed circuit board, wherein the chip package is attached to the printed circuit board.

Example 28 is a method of forming an integrated circuit. The method includes forming a multilayer fin over a substrate having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a sacrificial plug adjacent to the multilayer fin; forming a first source or drain region over the sacrificial plug and coupled to the ends of the second material layers; forming an insulating layer over the first source or drain region; forming a second source or drain region coupled to the ends of the fourth material layers and over the insulating layer; forming a first conductive contact that extends through the second source or drain region; removing the sacrificial plug from a backside of the substrate; and forming a second conductive contact from the backside of the substrate that extends through the first source or drain region, such that the second conductive contact directly contacts the first conductive contact.

Example 29 includes the subject matter of Example 28, wherein the first and third material layers comprise silicon and germanium and the second and fourth material layers comprise silicon.

Example 30 includes the subject matter of Example 28 or 29, wherein the second section of the fin is separated from the first section of the fin by a vertical distance between about 10 nm and about 80 nm.

Example 31 includes the subject matter of any one of Examples 28-30, further comprising removing the first and third material layers.

Example 32 includes the subject matter of Example 31, further comprising forming a first gate structure around portions of the second material layers and forming a second gate structure around portions of the fourth material layers.

Example 33 includes the subject matter of any one of Examples 28-32, wherein the sacrificial plug comprises titanium and nitrogen.

Example 34 includes the subject matter of any one of Examples 28-33, wherein forming the second conductive contact from the backside comprises using reactive ion etching (RIE) to form a recess through the first source or drain region.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
a first semiconductor device having one or more first semiconductor bodies extending in a first direction between a first source or drain region and a second source or drain region;
a second semiconductor device having one or more second semiconductor bodies extending in the first direction between a third source or drain region and a fourth source or drain region, the one or more first semiconductor bodies spaced vertically from the one or more second semiconductor bodies in a second direction different from the first direction, the third source or drain region spaced vertically from the first source or drain region in the second direction;
an insulating layer between the first source or drain region and the third source or drain region;

a first conductive contact extending through the first source or drain region in the second direction; and a second conductive contact extending through the third source or drain region in the second direction, wherein the second conductive contact directly contacts the first conductive contact, and wherein the first conductive contact has a tapered end, and the second conductive contact has a tapered end, and wherein the tapered end of the first conductive contact directly contacts the tapered end of the second conductive contact.

2. The integrated circuit of claim 1, wherein the one or more first semiconductor bodies and the one or more second semiconductor bodies are nanoribbons or nanosheets that comprise germanium, silicon, or both silicon and germanium.

3. The integrated circuit of claim 1, wherein the first conductive contact extends through an entire thickness of the first source or drain region in the second direction, and the second conductive contact extends through an entire thickness of the third source or drain region in the second direction.

4. The integrated circuit of claim 1, wherein the first source or drain region includes one or more first regions that contact corresponding one or more first semiconductor bodies and a second region that contacts each of the one or more first regions, the second region having a higher dopant concentration than each of the one or more first regions.

5. The integrated circuit of claim 4, wherein the first conductive contact extends through the second region and does not contact any of the one or more first regions.

6. The integrated circuit of claim 4, wherein the third source or drain region includes one or more third regions that contact corresponding one or more second semiconductor bodies and a fourth region that contacts each of the one or more third regions, the fourth region having a higher dopant concentration than each of the one or more third regions.

7. The integrated circuit of claim 6, wherein the second conductive contact extends through the fourth region and does not contact any of the one or more third regions.

8. The integrated circuit of claim 1, wherein the first conductive contact and the second conductive contact each include: (1) a continuous body of conductive material; and (2) one or more layers at the periphery of the continuous body, the one or more layers including a metal.

9. A die comprising the integrated circuit of claim 1.

10. An electronic device, comprising:

a chip package comprising one or more dies, at least one of the one or more dies comprising a first semiconductor device having one or more first semiconductor nanoribbons extending in a first direction between a first source or drain region and a second source or drain region;

a second semiconductor device having one or more second semiconductor nanoribbons extending in the first direction between a third source or drain region and a fourth source or drain region, the one or more first semiconductor nanoribbons spaced vertically from the one or more second semiconductor nanoribbons in a second direction different from the first direction, the third source or drain region spaced vertically from the first source or drain region in the second direction;

an insulating layer between the first source or drain region and the third source or drain region;

a first conductive contact extending through the first source or drain region in the second direction; and a second conductive contact extending through the third source or drain region in the second direction, wherein the second conductive contact directly contacts the first conductive contact, and wherein the first conductive contact has a tapered end, and the second conductive contact has a tapered end, and wherein the tapered end of the first conductive contact directly contacts the tapered end of the second conductive contact.

11. The electronic device of claim 10, wherein the one or more first semiconductor nanoribbons and the one or more second semiconductor nanoribbons comprise germanium, silicon, or any combination thereof.

12. The electronic device of claim 10, wherein the first source or drain region includes one or more first regions that contact corresponding first semiconductor nanoribbons and a second region that contacts each of the one or more first regions, the second region having a higher dopant concentration than each of the one or more first regions.

13. The electronic device of claim 12, wherein the first conductive contact extends through the second region and does not contact at least one of the one or more first regions.

14. The electronic device of claim 13, wherein the first conductive contact does not contact any of the one or more first regions.

15. The electronic device of claim 12, wherein the third source or drain region includes one or more third regions that contact corresponding second semiconductor nanoribbons and a fourth region that contacts each of the one or more third regions, the fourth region having a higher dopant concentration than each of the one or more third regions.

16. The electronic device of claim 15, wherein the second conductive contact extends through the fourth region and does not contact at least one of the one or more third regions.

17. The electronic device of claim 16, wherein the second conductive contact does not contact any of the one or more third regions.

18. The electronic device of claim 10, further comprising a printed circuit board, wherein the chip package is attached to the printed circuit board.

19. An integrated circuit comprising:

a first semiconductor device having one or more first semiconductor bodies extending in a first direction from a first source or drain region;

a second semiconductor device having one or more second semiconductor bodies extending in the first direction from a second source or drain region, the one or more first semiconductor bodies spaced vertically from the one or more second semiconductor bodies in a second direction different from the first direction, the first source or drain region spaced vertically from the second source or drain region in the second direction;

an insulating layer between the first source or drain region and the second source or drain region; and a conductive structure extending through both the first source or drain and the second source or drain region in the second direction, the conductive structure comprising a first contact extending through the first source or drain region in the second direction; and a second contact extending through the second source or drain region in the second direction, wherein the conductive structure has an aspect ratio between 8:1 and 12:1 and includes a divot at a location where the first contact meets the second contact.

20. The integrated circuit of claim 19, wherein the first contact extends through an entire thickness of the first source or drain region in the second direction, and the second contact extends through an entire thickness of the second source or drain region in the second direction.

\* \* \* \* \*